(12) United States Patent
Hasegawa et al.

(10) Patent No.: US 6,713,231 B1
(45) Date of Patent: Mar. 30, 2004

(54) METHOD OF MANUFACTURING SEMICONDUCTOR INTEGRATED CIRCUIT DEVICES

(75) Inventors: Norio Hasegawa, Nishitama (JP); Akira Imai, Hachiouji (JP); Katsuya Hayano, Ome (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 09/707,833

(22) Filed: Nov. 8, 2000

(30) Foreign Application Priority Data

Feb. 17, 2000 (JP) ......................................... 2000-039706

(51) Int. Cl.$^7$ .............................. G03F 7/00; G03F 9/00
(52) U.S. Cl. ........................... 430/311; 430/5; 430/394; 430/396
(58) Field of Search ................. 430/311, 312, 430/394, 396, 5

(56) References Cited

U.S. PATENT DOCUMENTS

| | | | |
|---|---|---|---|
| 5,532,114 A | * | 7/1996 | Bae |
| 5,932,377 A | * | 8/1999 | Ferguson et al. |
| 5,958,656 A | | 9/1999 | Nakao ........................ 430/394 |
| 6,165,692 A | * | 12/2000 | Kanai et al. |
| 6,327,022 B1 | * | 12/2001 | Nishi |
| 2001/0050761 A1 | | 12/2001 | Uzama ........................ 355/53 |

FOREIGN PATENT DOCUMENTS

| | | | |
|---|---|---|---|
| EP | 0915384 | | 5/1999 |
| JP | 05197126 | | 8/1993 |
| JP | 6-83082 | | 3/1994 |
| JP | 06083032 | | 3/1994 |
| JP | 7-77796 | | 3/1995 |
| JP | 07-077796 | * | 3/1995 |
| JP | 07-181666 | * | 7/1995 |
| JP | 7-181666 | | 7/1995 |
| JP | 10012543 | | 1/1998 |
| JP | 11111601 | | 4/1999 |
| JP | 11143085 | | 5/1999 |
| JP | 11233429 | | 8/1999 |

* cited by examiner

Primary Examiner—Mark F. Huff
Assistant Examiner—Kripa Sagar
(74) Attorney, Agent, or Firm—Antonelli, Terry, Stout & Kraus, LLP

(57) ABSTRACT

To alleviate the absolute value control accuracy of phases in a mask having a groove shifter structure, transfer regions 4C, 4D formed at different planar positions on the same plane of the same mask 2 are subjected to a multiple exposure by scanning exposure. Although identical mask patterns are formed over the transfer regions 4C, 4D, respective groove shifters 2d provided to these mask patterns are arranged opposite from each other.

27 Claims, 27 Drawing Sheets

4C, 4D : TRANSFER REGION
2d: GROOVE SHIFTER

METHOD OF MANUFACTURING SEMICONDUCTOR INTEGRATED CIRCUIT DEVICES

The present invention relates to a method of manufacturing semiconductor integrated circuit devices, and, more particularly, to an effective technique applicable to a type of lithography which uses a phase shift mask during exposure processing.

For example, in Japanese Laid-open Patent Publication 83032/1994, in describing a mask having a structure which uses a resist for writing electron beams or a silicon oxide film as a material of a phase shifter of a phase shift mask, the attenuation of the exposure light derived from the light transmittance of a shifter portion in the form of a film is mentioned as a problem. Then, as means for solving this problem, the publication discloses a technique to reduce attenuation of the exposure light at the shifter portion by exposing identical mask patterns of two respective physically separate masks by superposition exposure.

Further, Japanese Laid-open Patent Publication 233429/1999 discloses an exposure technique in which multiple exposures are produced by changing the exposure conditions in accordance with the characteristics of patterns which constitute objects to be exposed.

Further, Japanese Laid-open Patent Publication 111601/1999 discloses a super resolution double scanning exposure technique to solve a problem which occurs when two masks are used in multiple exposure processing, wherein the mask exchanging operation becomes necessary at the time of the exposure processing so that the throughput of the exposure step is lowered and the manufacturing cost is increased, in addition to other problems. In this technique, identical mask patterns are formed on different planar positions of one sheet of a mask and then multiple exposures are performed over the mask patterns by a scanning system exposure processing.

Further, Japanese Laid-open Patent Publication 197126/1993 discloses an exposure technique which arranges shifter patterns which cross each other at different planar positions over the same mask substrate, and then performs a multiple exposure by shifting the shifting patterns which cross each other by a half pitch and transfers a pattern to the crossing region.

Further, Japanese Laid-open Patent Publication 12543/1998 discloses a superposition exposure technique which performs a multiple exposure by shifting patterns which cross each other by a half pitch and transfers a pattern to the crossing region.

Still further, Japanese Laid-open Patent Publication 143085/1999 discloses a multiple exposure technique which performs a multiple exposure by using two-luminous flux and ordinary light and transfers a pattern to the crossing region.

Heretofore, in the manufacture of semiconductor integrated circuit devices, the lithography technique has been used as a method for transferring fine patterns onto a semiconductor wafer. In the lithography technique, a projection exposure apparatus is mainly used and an integrated circuit pattern is formed by transferring a pattern of a photo mask mounted on the projection exposure apparatus onto the semiconductor wafer.

As such projection exposure apparatuses, there exist a stepper which transfers the pattern of the photo mask by a step-and-repeat process and a scanner which scans the photo mask and the semiconductor wafer in opposite directions from each other and continuously transfers slit-like exposure areas. The largest difference between the stepper and the scanner lies in the fact that the stepper transfers the pattern by using the entire surface of a projection lens, while the scanner transfers the pattern by using only a slit-like portion extending in a diameter direction of a projection lens.

By the way, the refinement of patterns constituting the semiconductor integrated circuit devices is achieved by the enhancement of the performance of a reduced size projection exposure apparatus which is mainly used in a lithography step of a process of manufacture of semiconductor integrated circuit devices. However, to further enhance the fine processing of the patterns, it becomes necessary to enlarge the diameter of the numerical aperture NA of the reduced size projection exposure apparatus. Particularly, to obtain a high resolution in the fine hole patterns arranged with high density, it becomes necessary to set the exposure light to have a shorter wavelength and higher NA. However, this requires a huge amount of facility investment, and, hence, it is not realistic to undertake a new facility investment without completing the depreciation of the semiconductor manufacturing device under the current situation in which the fine processing level of the semiconductor integrated circuit devices has been accelerated year by year. Accordingly, recently, in the lithography technique, a photo mask which includes phase information on lights passing through the photo mask, such as a phase shift mask, has been under development. The phase shift mask technique is a technique which enhances the resolution and the focal depth by operating on the phase of light which passes through the photo mask (including a reticle) As such a phase shift mask technique, for example, there exists the Levenson type phase shift mask technique which arranges a phase shifter on one of neighboring light transmission regions and inverts the phases of the lights which pass through both light transmission regions relative to each other and the like.

A groove shifter is a phase shifter which forms recessed portions in a transparent film or a transparent mask substrate or the like which, constitutes a lower layer than a light shielding film over the mask. For example, the phase shifter is formed by digging grooves in the transparent film or the transparent mask substrate exposed from one of neighboring light transmission patterns of the mask such that the phases of lights which pass through the neighboring light transmission patterns are inverted by 180 degrees relative to each other.

The inventors, however, have found that the phase shift mask technique having the above-mentioned groove shifter structure has the following problems.

That is, a first problem is that, along with the refinement of the patterns, the control of the phase difference is required to satisfy a high accuracy. For example, in case KrF excimer laser light is used as the exposure light, the depth of the groove shifter is approximately 245 nm. Assuming that the allowable phase error is 2 degrees, the groove forming amount of the mask substrate is required to satisfy an accuracy of approximately ±3 nm. However, the mask substrate is constituted by a glass substrate which is made of quartz or the like, and it is impossible to perform the depth adjustment or the like by the temperature control or the like. Accordingly, it is difficult to form grooves which fall within such a range (accuracy) by using dry etching processing for forming the groove. In this manner, with respect to the phase shift mask having a groove shifter structure, the absolute value control of the phase becomes a large problem.

A second problem is that, in the phase shift mask, due to the mask structure provided for producing the phase difference, the dimensional accuracy of the transfer patterns is lowered. For example, in the groove shifter structure, due to the influence of the side surfaces of groove-formed portions of the mask, the amount of transmitted light is decreased and eventually a difference arises between the dimensions of respective patterns which are transferred by the light passing through a place in which the groove shifter is arranged and the light passing through another place in which the groove shifter is not arranged and which is disposed close to the previous place. To cope with this, in the groove shifter portion, a structure (fine eaves type groove shifter structure) which makes the transparent film or the transparent mask substrate overhang in the groove width direction, so as to have end portions of the light shielding patterns protrude like eaves, is adopted. However, along with the refinement of the transfer patterns, there exists the problem that the dimensional difference between the transfer patterns cannot be eliminated even with the fine eaves type groove shifter structure.

A third problem is that the manufacturing of masks becomes difficult due to the highly accurate absolute value control of phases and the formation of a fine eaves type groove shifter. Further, along with the refinement of the transfer patterns, the mask defect inspection and the mask correction are required to satisfy a high accuracy. Accordingly, the yield rate is decreased.

Accordingly, it is an object of the present invention to provide a technique which can attenuate the absolute value control accuracy of the phase in a mask having a groove shifter structure.

It is another object of the present invention to provide a technique which can enhance the dimensional accuracy of transfer patterns by using a mask having a groove shifter structure.

It is a still another object of the present invention to provide a technique which can attenuate the detected dimensions of the inspection of a mask having a groove shifter structure.

It is a further object of the present invention to provide a technique which can enhance the ease of manufacture of masks having a groove shifter structure.

It is a still further object of the present invention to provide a technique which can enhance the yield in the manufacture of masks having a groove shifter structure.

The above-mentioned objects, other objects and novel features of the present invention will become apparent in view of the description of the specification and the attached drawings.

SUMMARY OF THE INVENTION

A brief summary of typical aspects of the invention to be disclosed in the present application will be presented.

That is, the method of manufacturing semiconductor integrated circuit devices according to the present invention, includes a step in which, when transfer regions formed over a mask are exposed to a wafer by an exposure processing, by exposing a plurality of different transfer regions which have identical mask patterns in the mask and have groove shifters arranged opposite from each other when superposed on a same transfer region over the wafer, a given integrated circuit pattern is transferred onto the wafer.

Further, the method of manufacturing semiconductor integrated circuit devices according to the present invention includes a step in which a first phase shift mask pattern, including a groove shifter formed in a substrate, is exposed by reduced size projection exposure using an ultraviolet light projected onto a first region of a first main surface of a wafer, and a step in which a second phase shift mask pattern, including a groove shifter formed in a substrate and having a phase thereof inverted from a phase of the first phase shift mask pattern, is exposed by reduced size projection exposure using an ultraviolet light projected onto the first region of the first main surface of the wafer.

Further, the method of manufacturing integrated circuit devices according to the present invention includes a step in which a first phase shift mask pattern, including an on substrate thin film groove shifter, is exposed by reduced size projection exposure using an ultraviolet light projected onto a first region of a first main surface of a wafer, and a step in which a second phase shift mask pattern, including an on-substrate thin film groove shifter and having a phase thereof inverted from a phase of the first phase shift mask pattern, is exposed by reduced size projection exposure using an ultraviolet light projected onto the first region of the first main surface of the wafer.

Further, the method of manufacturing semiconductor integrated circuit devices according to the present invention includes a step in which a first phase shift mask pattern is exposed by reduced size projection exposure using an ultraviolet light projected onto a first region of a first main surface of a wafer, and a step in which a second phase shift mask pattern, formed over the same main surface over the same mask substrate as the first phase shift mask pattern and having a phase thereof inverted from a phase of the first phase shift mask pattern, is exposed by reduced size projection exposure using an ultraviolet light projected onto the first region of the first main surface of the wafer.

Further, the method of manufacturing semiconductor integrated circuit devices according to the present invention includes a step in which a first phase shift mask pattern, including a fine eaves type groove shifter, is exposed by reduced size projection exposure using an ultraviolet light projected onto a first region of a first main surface of a wafer, and a step in which a second phase shift mask pattern including a fine eaves type groove shifter and having a phase thereof inverted from a phase of the first phase shift mask pattern, is exposed by reduced size projection exposure using an ultraviolet light projected onto the first region of the first main surface of the wafer.

Further, the method of manufacturing semiconductor integrated circuit devices according to the present invention includes a step in which a first phase shift mask pattern is exposed by reduced size projection exposure using an ultraviolet light projected onto a first region of a first main surface of a wafer, a step in which a second phase shift mask pattern having a phase thereof inverted from a phase of the first phase shift mask pattern is exposed by reduced size projection exposure using an ultraviolet light projected onto the first region of the first main surface of the wafer, a step in which the first phase shift mask pattern is again exposed by reduced size projection exposure using an ultraviolet light projected onto the first region of the main surface of the wafer, and a step in which the second phase shift mask pattern is again exposed by reduced size projection exposure using an ultraviolet light projected onto the first region of the first main surface of the wafer.

Further, in the method of manufacturing semiconductor integrated circuit devices according to the present invention, the second phase shift mask pattern is formed over the same main surface of the same mask substrate as the first phase shift mask pattern.

Further, in the method of manufacturing semiconductor integrated circuit devices according to the present invention, the exposure in at least some steps is performed by scanning exposure.

Further, in the method of manufacturing semiconductor integrated circuit devices according to the present invention, the first and second phase shift mask patterns are of Levenson type.

Further, in the method of manufacturing semiconductor integrated circuit devices according the present invention, mask patterns of the Levenson type are provided for transferring line-and-space patterns.

Further, in the method of manufacturing semiconductor integrated circuit devices according to the present invention, mask patterns of the Levenson type are provided for transferring a plurality of hole patterns.

Further, the method of manufacturing semiconductor integrated circuit devices according to the present invention includes a step in which a first phase shift mask pattern, including an auxiliary pattern, is exposed by reduced size projection exposure using an ultraviolet light projected onto a first region of a first main surface of a wafer, and a step in which a second phase shift mask pattern, including an auxiliary pattern and having a phase thereof inverted from a phase of the first phase shift mask pattern, is exposed by reduced size projection exposure using an ultraviolet light projected onto the first region of the first main surface of the wafer.

Further, the method of manufacturing semiconductor integrated circuit devices according to the present invention includes a step in which a first phase shift mask pattern, including a groove shifter, is subjected to scanning exposure by reduced size projection exposure using an ultraviolet light as an exposure light projected onto a first region of a first main surface of a wafer, and a step in which a second phase shift mask pattern, including a groove shifter and having a phase thereof inverted from a phase of the first phase shift mask pattern, is subjected to scanning exposure by reduced size projection exposure using an ultraviolet light as an exposure light projected onto the first region of the first main surface of the wafer.

Further, the method of manufacturing semiconductor integrated circuit devices according to the present invention includes a step in which a first phase shift mask pattern is subjected to scanning exposure by reduced size projection using an ultraviolet light as an exposure light projected onto a first region of a first main surface of a wafer, and a step in which a second phase shift mask pattern having a phase thereof inverted from a phase of the first phase shift mask pattern is subjected to scanning exposure by reduced size projection using an ultraviolet light as an exposure light projected onto the first region of the first main surface of the wafer.

Further, a brief summary of other typical features as disclosed in the present application will be presented.

The method of manufacture semiconductor integrated circuit devices according to the present invention includes a step in which a plurality of transfer regions arranged on different planar positions over the same surface of the same mask are exposed onto the same region of the wafer by superposition exposure to transfer a given integrated circuit pattern over the wafer. In performing such a superposition exposure, a plurality of transfer regions which arrange identical mask patterns thereon and have groove shifters arranged such that the respective lights which pass through the same planar position when the transfer regions are superposed have their phases inverted relative to each other are superposed and then an exposure is carried out.

The method of manufacture of semiconductor integrated circuit devices according to the present invention includes a step in which a plurality of transfer regions arranged on different planar positions over the same surface of the same mask are exposed by scanning onto the same region of the wafer by superposition exposure to transfer a given integrated circuit pattern over the wafer. In performing such a superposition exposure, a plurality of transfer regions which arrange identical mask patterns thereon and have groove shifters arranged such that the respective lights which pass through the same planar position when the transfer regions are superposed have their phases inverted relative to each other are superposed and then an exposure is carried out.

The method of manufacture of semiconductor integrated circuit devices according to the present invention includes a step in which a plurality of transfer regions arranged on different planar positions over the same surface of the same mask are exposed by scanning onto the same region of the wafer by superposition exposure to transfer a given integrated circuit pattern over the wafer. In performing such a superposition exposure, a plurality of transfer regions which arrange identical mask patterns thereon and have groove shifters arranged such that the respective lights which pass through the same planar position when the transfer regions are superposed have their phases inverted relative to each other are superposed and then an exposure is carried out. Further, a plurality of transfer regions which are superposed in performing this superposition exposure are juxtaposed along the scanning direction of an exposure region of the scanning exposure over the mask.

The method of manufacture of semiconductor integrated circuit devices according to the present invention includes a step in which a plurality of transfer regions arranged on different planar positions over the same surface of the same mask are exposed onto the same region of the wafer by superposition exposure to transfer a given integrated circuit pattern over the wafer. In performing such a superposition exposure, a plurality of transfer regions which arrange identical mask patterns thereon and have groove shifters arranged such that the respective lights which pass through the same planar position when the transfer regions are superposed have their phases inverted relative to each other are superposed and then an exposure is carried out. Further, the mask pattern includes a main light transmission pattern which is transferred to the wafer and auxiliary mask patterns which are arranged in the vicinity of the main light transmission pattern and are formed in a dimension which prevents the transfer of the auxiliary mask patterns onto the wafer. In respective transfer regions to be superposed, groove shifters are arranged such that the lights which pass through the main light transmission pattern and the auxiliary mask patterns have their phases inverted relative to each other.

In the method of manufacture of semiconductor integrated circuit devices according to the present invention, the groove shifters described above are constituted by substrate groove shifters which are formed by grooves formed in the mask substrate per se which constitutes the mask.

In the method of manufacture of semiconductor integrated circuit devices according to the present invention, the groove shifters described above are constituted by thin film groove shifters which are formed by grooves formed in a shifter film interposed between the mask substrate and a light shielding pattern, which constitute the mask, wherein the grooves are formed such that the surface of the mask substrate is exposed.

In the method of manufacture of semiconductor integrated circuit devices according to the present invention, the groove shifters described above are constituted by fine eaves type groove shifters having a structure where grooves which constitute the groove shifters reach a position below an end portion of a light shielding pattern and the end portions of the light shielding pattern are protruded.

In the method of manufacture of semiconductor integrated circuit devices according to the present invention, the eaves length of the fine eaves type groove shifters is set to be equal to or less than 70% of the wavelength of the exposure light.

In the method of manufacture of semiconductor integrated circuit devices according to the present invention, the eaves length of the fine eaves type groove shifters is set to be equal to or less than 40% of the wavelength of the exposure light.

In the method of manufacture of semiconductor integrated circuit devices according to the present invention, in a plurality of respective transfer regions, the mask pattern has a plurality of light transmission patterns which are disposed in parallel and close to each other and the groove shifter is arranged on either one of the light transmission patterns which are disposed close to each other.

In the method of manufacture of semiconductor integrated circuit devices according to the present invention, a process for manufacturing the mask includes a step (a) in which a resist pattern for forming grooves is formed over a mask substrate on which a light shielding pattern and a light transmission pattern are formed, a step (b) in which the resist pattern is used as a mask and then a groove is dug in the mask substrate exposed from the resist pattern so as to form a groove shifter, and a step (c) in which a phase is inspected after removing the resist pattern.

In the method of manufacture of semiconductor integrated circuit devices according to the present invention, the process for forming the groove shifter of the mask includes a step (a) in which a resist pattern for forming grooves is formed over a mask substrate on which a light shielding pattern and a light transmission pattern are formed, a step (b) in which the resist pattern is used as a mask and then a groove is dug in the mask substrate exposed from the mask so as to form a groove shifter, a step (c) in which a phase is inspected after removing the resist pattern, and a step (d) in which an isotropic wet etching processing is performed over the mask after the step (c) so as to remove the surface of the mask by etching.

BRIEF DESCRIPTION OF THE DRAWINGS

FIG. 10($b$) is a graph showing the distribution of the intensity of the transmitting light of the phase shift mask of FIG. 10($a$) FIG. 10($c$) is a plan view of a pattern transferred by the phase shift mask of FIG. 10($a$).

FIG. 11($b$) is a graph showing the distribution of the intensity of the transmitting light of the phase shift mask of FIG. 11($a$). FIG. 11($c$) is a plan view of a pattern transferred by the phase shift mask of FIG. 11($a$).

FIG. 15($b$) is a cross-sectional view taken along a line A—A and a line B—B of FIG. 15($a$) . FIG. 15($c$) shows graphs of the distribution of intensity of lights which have passed through respective regions in FIG. 15($a$). FIG. 15($d$) is a graph showing the distribution of light intensity obtained when the exposure is performed while superposing respective transfer regions of FIG. 15($a$).

FIG. 19($b$) is a cross-sectional view taken along a line A—A of FIG. 19($a$). FIG. 19($c$) is a plan view of a photo resist pattern when the photo mask of FIG. 19($a$) is exposed once at the time of exposure processing using a scanner.

FIG. 20($b$) is a cross-sectional view taken along a line A—A and a line B—B of FIG. 20($a$) FIG. 20($c$) is a plan view of a photo resist pattern when transfer regions at two positions of FIG. 20(a) are exposed by superposition exposure using a scanner.

DESCRIPTION OF THE PREFERRED EMBODIMENTS

Figure 1:
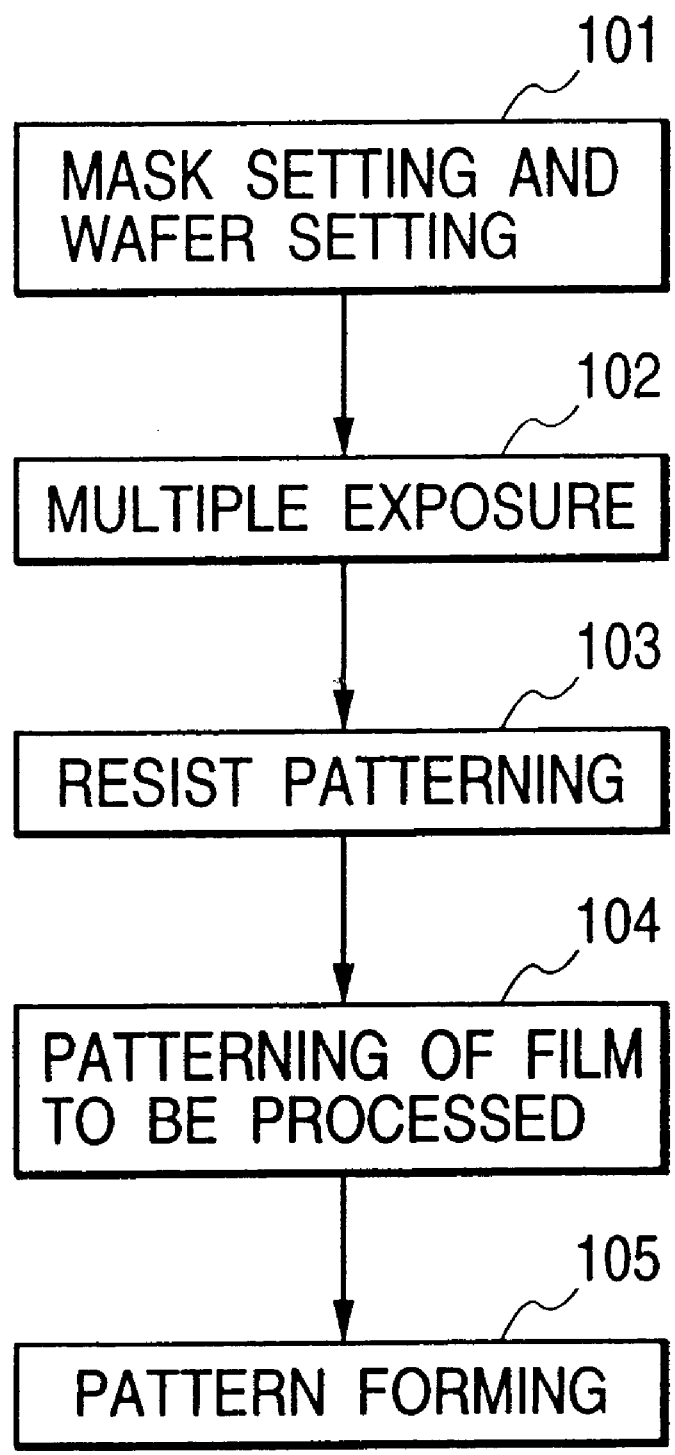
FIG. 1 is a flow diagram of a method of manufacture of semiconductor integrated circuit devices according to one embodiment of the present invention.

To explain embodiments of the present inventions, the basic meanings of terms used in the present application will be explained.

1. Ultra violet light: In the field of semiconductors, the term ultraviolet light means an electromagnetic wave having a wavelength ranging from around 450 nm to equal to or less than 50 nm in short wavelength. Ultraviolet light having a wavelength exceeding 300 nm is referred to as being in the near ultraviolet ray range and ultraviolet light having a wavelength below 300 nm is referred to as being in the far ultraviolet range, while ultraviolet light having a wavelength equal to or less than 200 nm is specifically referred to as being in the vacuum ultraviolet range. As light sources, the i beam (wavelength: 365 nm) and g beam (wavelength: 436 nm) of a mercury arc lamp or the like, a Krf excimer laser (wavelength: 248 nm), ArF and F2 excimer laser and the like can be used.

2. Scanning exposure: This term refers to an exposure method in which, by continuously moving (scanning) a thin slit like exposure band relative to a wafer and mask (or reticle, in the present invention, the term "mask" having a wide concept which includes the reticle) in a direction perpendicular to the longitudinal direction of the slit, a circuit pattern over the mask is transferred to a given portion over the wafer.

3. Step-and-scan exposure: This refers to a method which exposes all portions to be exposed on the wafer by combining the above-mentioned scanning exposure and a stepping exposure. This constitutes a sub-concept of the above-mentioned scanning exposure.

4. Substrate groove shifter: This refers to a phase shifter which forms a recessed portion on a surface of a transparent mask substrate per se made of quartz or the like. "On a surface of the substrate per se," includes a case in which a film being made of a material similar to that of the substrate is formed over the surface of the substrate.

5. On-substrate thin film groove shifter: This refers to a groove-type shifter which is constituted by a shifter film having a thickness suitable for achieving a purpose to operate as a shifter. The shifter film is formed below a shielding film over the substrate and is formed by making use of the difference of etching speed between the background substrate and the shifter film.

6. Groove shifter: This is an upper concept which includes the above-mentioned substrate groove shifter and the on-substrate thin film groove shifter and refers to shifters in general, each of which forms a recessed portion in a transparent film or a transparent substrate which constitutes a lower layer disposed below a light shielding layer. On the other hand, a shifter of a system which arranges a shifter film over the shielding film is called a shifter of a shifter film upper mounting system or an upper mounting system.

7. Fine eaves groove shifter: This refers to a groove shifter in which, in a peripheral side (in the direction of a cross section having a narrow width) of the groove shifter, a light shielding film protrudes in an overhung manner (or in an eaves-shape) toward the inside of a recessed portion from an upper end of a side wall of the recessed portion formed in a quartz substrate or the like. Here, assuming the wavelength $\lambda$ of the monochromatic exposure light is used as a reference, the length P of the protruding portion is set to be equal to or less than 40% ($P/\lambda=40\%$). This length P is called the "eaves length".

8. Phase shift mask pattern: This refers to a circuit pattern on a mask including a mask opening pattern which has at least one phase shifter. For example, this implies a group of circuit patterns over the mask corresponding to a single shot region (range exposed by one step) in the stepping exposure or a region exposed by a single scanning in the scanning exposure. For example, this refers to mask patterns (circuit patterns) on a unit chip region on a wafer or on a mask substrate having an area which is an integer times larger than that of the unit chip region.

9. Auxiliary mask pattern: This generally refers to an opening pattern on a mask which does not form an independent image corresponding to the opening pattern when the opening pattern is projected onto a wafer.

10. Levenson type phase shift mask: This is also called a space frequency modulation type phase shift mask. This generally refers to a phase shift mask which is made up of a group of openings wherein a plurality of openings are formed such that they are disposed close to each other while being separated by a light shielding film at light shielding regions and they alternately have inverse phases. To roughly classify the Levenson type phase shift mask, it includes a line-and-space pattern and an alternating inverting hole pattern (also called "Levenson pattern for contact holes") and the like.

11. Auxiliary pattern system phase shift mask: This phase shift mask is roughly classified into a phase shift mask for isolated line patterns and a phase shift mask for hole patterns. The former is represented by an actual opening pattern and auxiliary shifter patterns (phase inverted patterns also being equivalent to this patterns) which are disposed at both sides of the actual opening pattern. The latter is represented by an outrigger type hole pattern (being made of a central actual opening and a plurality of auxiliary openings disposed around the actual opening). However, since auxiliary openings and auxiliary shifters are provided at end portions or the periphery of a mask pattern of the Levenson type shift mask, both systems are used in combination in actual patterns.

12. Shifter edge system phase shift mask: This phase shift mask is roughly classified into a single edge system which forms a pattern by an edge of a transparent shifter, a both edge system which forms a pattern by both edges of a fine or minute transparent shifter, an edge emphasis system which disposes a shifter edge in an opening, a halftone system which makes these shifters semitransparent and the like.

13. Phase shift mask: In accordance with the present invention, when a mask is simply referred to as a "phase shift mask", it is intended as a general term which includes all of the above-mentioned photo shift masks.

14. "Wafer (semiconductor wafer, semiconductor substrate)" refers to a silicon single-crystal substrate (generally having an approximately planar circular shape), a sapphire substrate, a glass substrate, other insulating or non-insulating or semiconductor substrate, and a composite substrate made of them. Further, in accordance with the present invention, "Semiconductor integrated circuit devices" refers not only to devices which are formed over semiconductor or insulating substrates such as silicon wafers or sapphire substrates or the like, but also, unless otherwise particularly specified, to devices which are formed over other insulating substrates, such as glass substrates used in TFT (Tin-Film-Transistor), STN (Super-Twisted-Nematic) liquid crystal and the like.

15. The terms "light shielding region", "light shielding pattern", "light shielding film" or "light shielding" indicate that a region has optical characteristics which allow less than 40% of exposure light irradiated to the region to pass through the region. In general, this refers to a region having optical characteristics which allow exposure light from several % to 30% irradiated to the region to pass through the region being used. On the other hand, the terms "light transmitting region", "light transmitting pattern", "transparent region", "transparent film" or "transparent" indicate that a region has optical characteristics which allow 60% or more than 60% of exposure light irradiated to the region to pass through the region. In general, this refers to a region having optical characteristics which allow 90% or more than 90% of exposure light irradiated to the region to pass through the region.

16. "Photo resist pattern" refers to a film pattern which is formed by patterning a photosensitive organic film using a photolithography technique. This pattern includes a simple resist film which has no openings on a corresponding portion.

17. "Usual lighting" refers to non-deformation lighting which has a relatively uniform distribution of the intensity of light.

18. "Deformation lighting" refers to lighting which reduces the illuminance of a central portion and includes an oblique lighting, a bracelet lighting, a multiple pole lighting, such as a quadruple lighting, a quintet pole lighting or a super resolution technique using a pupil filter equivalent to such lighting.

19. Resolution: The pattern dimension can be expressed by standardizing it with numerical apertures NA (Numerical Apertures) of a projection lens and exposure wavelength $\lambda$. In this embodiment, KrF excimer laser light having an exposure wavelength of 248 nm and a projection lens having a numerical aperture NA of 0.65 are mainly used. Accordingly, when a different wavelength or a projection lens having a different numerical aperture NA is used, since the resolution R can be expressed by $R=K1\ \lambda/NA$, it may be used after conversion (for example, K1=0.6). However, since the focal depth D is also expressed by $K2\cdot\lambda/(NA)^2$, the focal depth becomes different.

20. Depth of shifter: The substrate digging depth of a shifter portion depends on the exposure wavelength, and the depth Z which reverses the phase at 180 degrees is expressed by $Z=\lambda/(2\ (n-1))$. Here, n is the refractive index of the substrate relative to exposure light having a given exposure wavelength and $\lambda$ is the exposure wavelength.

21. Transfer pattern: This is a pattern which is transferred on a wafer by a mask. To be more specific, this transfer pattern is a pattern which is actually formed over a wafer using the above-mentioned photo resist pattern as a mask.

In the embodiments explained hereinafter, when it is necessary for facilitating an understanding of the present invention, the inventive features are explained by separating them into a plurality of sections or as parts of different embodiments. However, unless otherwise specifically described, they are not considered irrelevant to each other. That is, each inventive feature has a relationship with other inventive features such that all inventive features partially or wholly constitute modifications, details or supplementary explanations of the invention.

Further, in the embodiments described hereinafter, when a specific number of elements or the like (including number, numerical value, quantity, range and the like) is referred to, unless otherwise explicitly specified and apparently restricted to a specific number in view of the principles of the invention, the number is not limited to the specific number and a number which is more than or less than the specific number may be used.

Further, in the embodiments described hereinafter, it is needless to say that the constituent components (including component steps and the like) are not necessarily essential unless otherwise explicitly specified and apparently considered essential in view of the principles of the invention.

Similarly, in the embodiments described hereinafter, when the shape, positional relationships and the like are referred to, unless otherwise explicitly specified and considered to be excluded in view of the principles the invention, they include shapes and the like which are similar to or analogous to the above-mentioned shapes and the like. The same goes for the above-mentioned numerical values and ranges.

In all of the drawings which illustrate the embodiments of the present invention, parts or components which have the same functions are identified by the same symbols, and repeated explanations of these parts or components are omitted.

Further, in the drawings which illustrate the embodiments of the present invention, to facilitate the understanding of the drawings, even when the drawings are plan views showing masks, hatching formed of oblique lines is provided to the light shielding patterns and the groove shifters.

Embodiment 1

FIG. 1 shows a process flow diagram of a method of manufacture semiconductor integrated circuit devices representing an embodiment 1.

First of all, a mask and a wafer are set to an exposure apparatus and their relative planar positions are aligned with each other. In this embodiment 1, a phase shift mask having groove shifters is used as a mask. Over the wafer, a film to be processed and a photo resist film are already stacked in order from a lower layer (step 101). Subsequently, a mask pattern of the mask is exposed to a photo resist film over the wafer. In this case, according to this embodiment 1, the mask pattern of the transfer region of the mask is exposed to one region over the wafer twice or more times by superposition exposure. Here, the mask patterns of the transfer regions which are formed at different position within the same mask or the mask patterns of the transfer regions of different masks which are physically separated, are exposed by superposition exposure at least twice. In this case, the respective mask patterns of respective transfer regions are identical and groove shifters are arranged on respective transfer regions such that the phases of lights which have passed through respective positions corresponding to respective transfer regions (positions which are superposed on a plane at the time of exposure) are inverted at 180 degrees from each other (step 1021). Then, after forming a photo resist pattern by applying a developing processing to the photo resist film (step 103), an etching processing is applied to a film to be processed using the photo resist pattern as a mask so as to perform patterning of the film to be processed (step 104). Thereafter, by removing the photo resist pattern, a given pattern made of the film to be processed is formed over the wafer (step 105). The technical concept of the present invention is applicable to a case where impurities are selectively doped to a given planar position of a semiconductor substrate by using the photo resist pattern as a mask.

Subsequently, one example of an exposure apparatus used in the above-mentioned multiple exposure processing will be explained in conjunction with FIG. 2 to FIG. 4.

Figure 2:
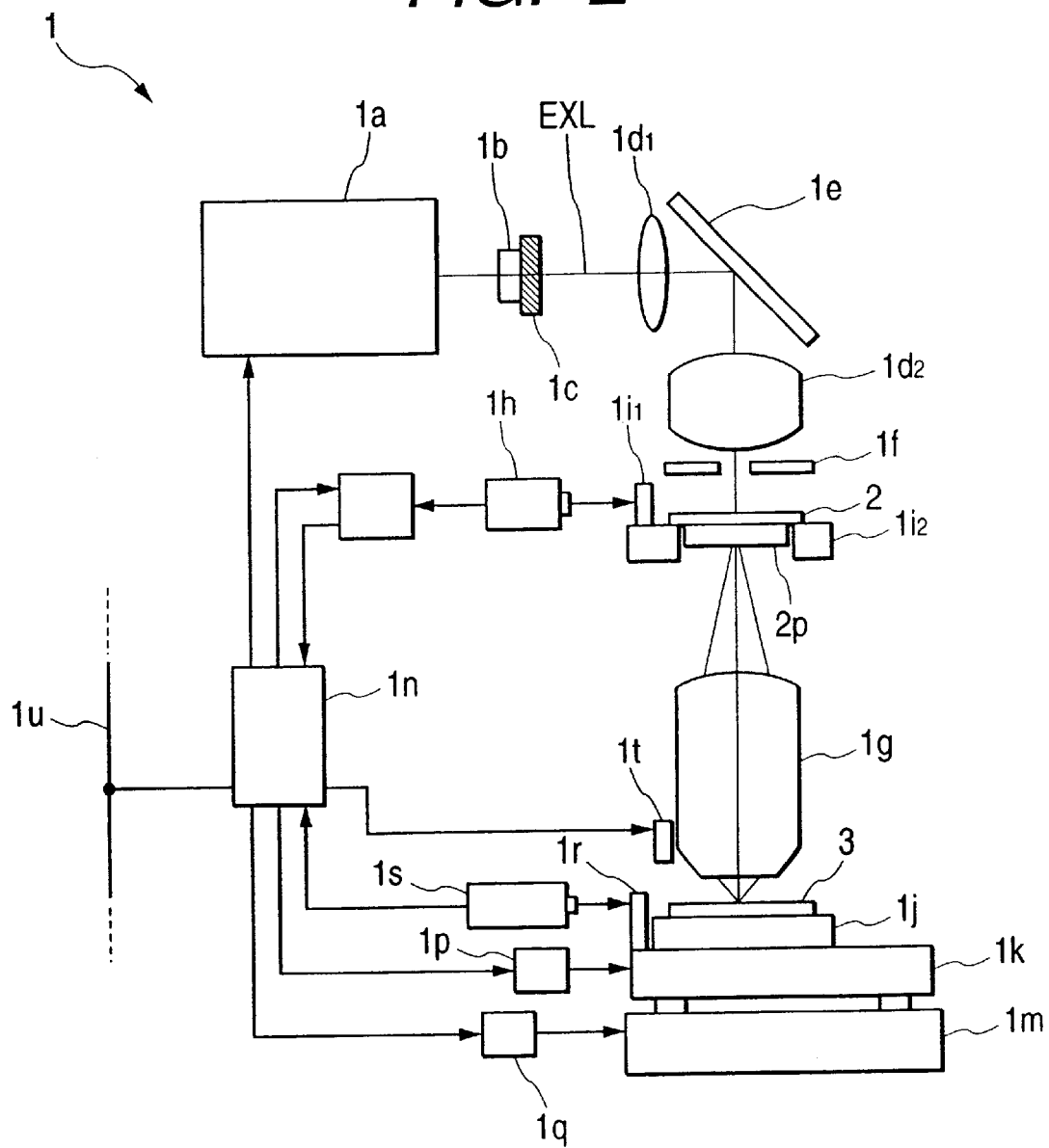
FIG. 2 is a schematic block diagram of one example of an exposure apparatus used in the manufacturing method shown in FIG. 1.

An exposure apparatus 1 shown in FIG. 2 is a scanning type reduced size projection exposure apparatus (hereinafter called a "scanner") having a reduction ratio of 4:1. The exposure conditions of the exposure apparatus 1 are as follows, for example. That is, as the exposure light EXL, a KrF excimer laser light having the exposure wavelength of around 248 nm is used, for example. The numerical aperture NA of an optical lens is set to NA=0.65. The shape of lighting is circular and the coherency (σ: sigma) value is set to σ=0.3. A Levenson type phase shift mask is used as the mask 2, for example. However, the exposure condition is not restricted to the above and various modifications may be considered. For example, ArF excimer laser light having the wavelength of 193 nm may be used, for example.

The light irradiated from an exposure light source $1a$ illuminates the mask 2 (here, reticle) through a fly-eye lens $1b$, an aperture $1c$, condenser lenses $1d1$, $1d2$ and a mirror $1e$. Among the optical conditions, the coherency is adjusted by changing the dimension of an opening portion of an aperture $1f$. Over the mask 2, a pellicle $2p$ is mounted so as to prevent a pattern transfer defect or the like which may be caused by the adhesion of foreign materials. The mask pattern drawn over the mask 2 is projected onto a wafer 3, which constitutes a sample substrate, through a projection lens $1g$. The mask 2 is placed on a mask stage $1i2$, which is controlled by mask position control means $1h$ and a mirror $1i1$; and, hence, the center of the mask 2 and an optical axis of the projection lens $1g$ can be accurately aligned or registered.

The wafer 3 is adhered to a sample platform $1j$ by vacuum. The sample platform $1j$ is mounted on a Z stage $1k$ which is movable in the optical axis direction of the projection lens $1g$, that is, in a direction (Z direction) perpendicular to the wafer mounting surface of the sample platform $1j$. Further, the sample platform $ij$ is mounted on a XY stage $1m$ which is movable in the directions parallel to the wafer mounting surface of the sample platform $1j$. Since the Z stage $1k$ and the XY stage $1m$ are driven, respectively, by drive means $1p$, $1q$ in response to control commands from a main control system $1n$, the wafer 3 is movable to a given exposure position. The position is accurately monitored by a laser length measuring machine $1s$ as a position of a mirror $1r$ fixedly secured to the Z stage $1k$. The surface position of the wafer 3 is measured by a focal position detection means which a usual exposure apparatus has. By moving the Z stage $1k$ in response to the result of measurement, the surface of the wafer 3 can be always aligned with an image focusing surface of the projection lens $1g$.

The mask 2 and the wafer 3 are synchronously driven in response to the reduction ratio, and, along with the scanning of the exposure region over the mask 2, the mask pattern is transferred in a reduced scale onto the wafer 3. Here, the surface position of the wafer 3 is also dynamically drive-controlled relative to the scanning of the wafer by means of the above-mentioned means. In case of exposing the circuit pattern over the mask 2 onto the circuit pattern formed over the wafer 3 by superposition exposure, the position of the mask pattern formed over the wafer 3 is detected using an alignment detection optical system $1t$, and then the wafer 3 is positioned based on the result of the detection and the double transfer is performed. The main control system $1n$ is electrically connected to a network equipment $1u$ so that the state of the exposure apparatus 1 can be monitored from a remote place.

Figure 3:
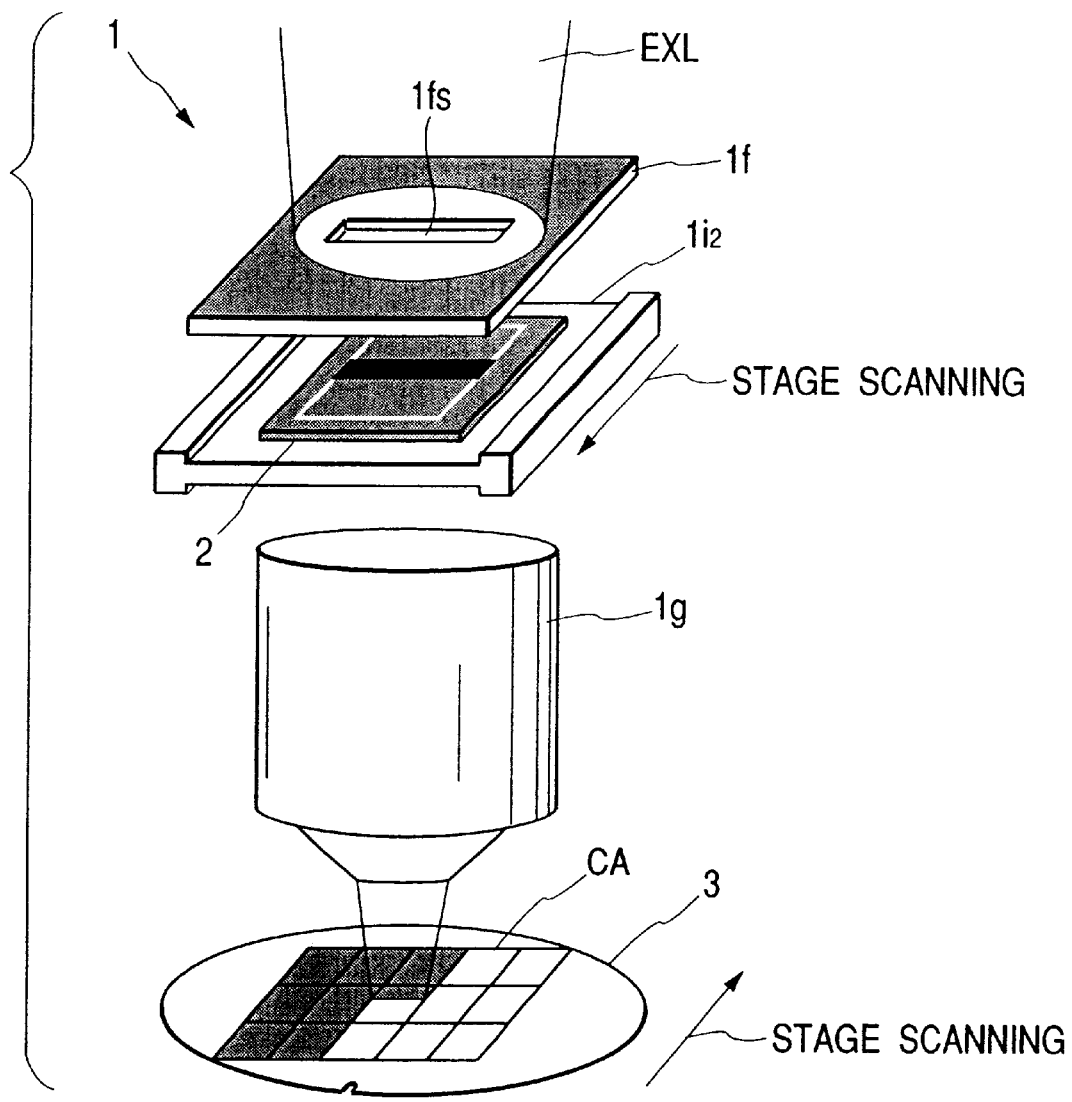
FIG. 3 is a perspective view of an essential part of the exposure apparatus shown in FIG. 2 in an extracted form.
Figure 4:
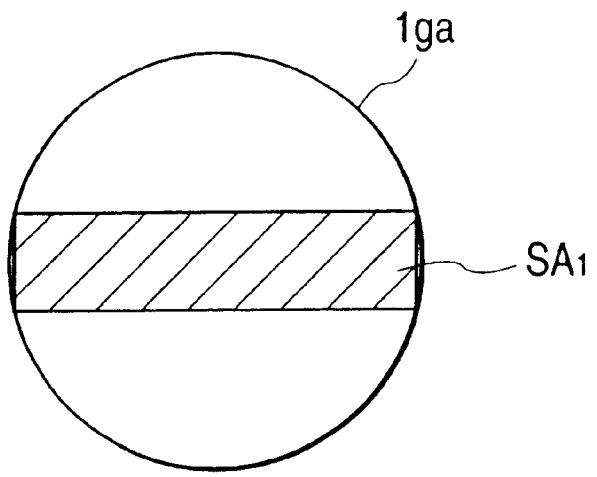
FIG. 4 is a plan view schematically showing an exposure region of the exposure apparatus shown in FIG. 2 and FIG. 3.

FIG. 3 is a view which schematically shows the scanning exposure operation of the above-mentioned exposure apparatus 1. Since the mask 2 and the wafer 3 have a mirror symmetrical relationship, in performing the exposure processing, the scanning direction of the mask 2 and the scanning direction of the wafer 3 become opposite to each other, as indicated by the arrow directions of stage scanning in FIG. 3. With respect to the drive distance, when the reduction ratio is set to 4:1, the amount of movement of the wafer 3 becomes 1 when the amount of movement of the mask 2 is 4. Here, by irradiating the exposure light EXL onto the mask 2 through the slit $1fs$, a slit-like exposure region (exposure strip) is formed. Then, over the mask 2, the slit-like exposure region is continuously moved (scanned) in the width direction of the slit 1fs, that is, in the direction which intersects the longitudinal direction of the slit 1fs perpendicularly or obliquely. Then, the exposure light is irradiated onto the wafer 3 through the image focusing optical system (projection lens 1g). Due to such an exposure operation, the mask patterns within the transfer regions of the mask 2 are transferred to a plurality of chip forming regions CA of the wafer 3, respectively. Here, each chip forming region CA is a region for forming one semiconductor chip.

Figure 5:
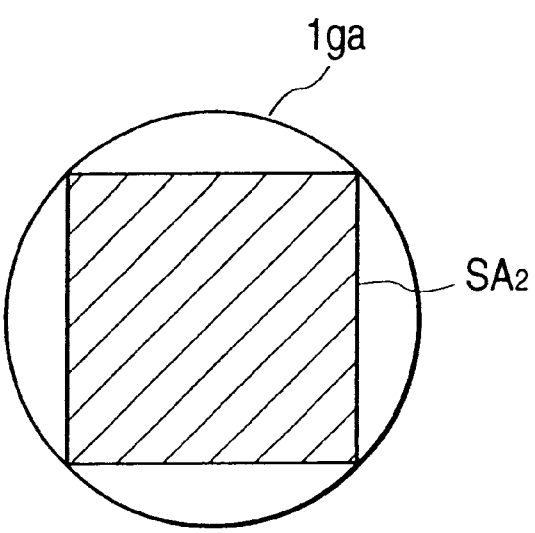
FIG. 5 is a plan view schematically showing an exposure region of a stepper.

The planar rectangular slit 1fs is formed in the aperture 1f and the exposure light EXL is irradiated to the mask 2 through the slit 1fs. That is, in the exposure apparatus 1, as shown in FIG. 3 and FIG. 4, a slit-like exposure region (hatching made of oblique lines given in FIG. 4 to facilitate an understanding of the drawing) SA1 which is included in an effective exposure region Iga of the projection lens 1g is used as an effective exposure region. Accordingly, the exposure apparatus (scanner) 1 exposes the slit-like exposure region SA1. Although not restricted specifically, the width of the slit 1fs is usually approximately 4–7 mm, for example, over the wafer 3. For comparison purposes, the exposure region by a stepper is shown in FIG. 5. In the stepper, a planar square exposure region (hatching made of oblique lines given in FIG. 5 to facilitate the understanding of the drawing) SA2 which has four corners thereof inscribed in an effective exposure region 1ga of the projection lens is used as an effective exposure region. Accordingly, in the stepper, the pattern in the mask 2 is exposed as a whole. The technical concept of the present invention is applicable to the stepper. Further, in FIG. 2 to FIG. 5, although only parts or components necessary for explaining the function of the exposure apparatus are shown, the exposure apparatus of the present invention is also provided with other parts or components which usual exposure apparatuses (scanners and steppers) have as a standard specification.

Figure 6A:
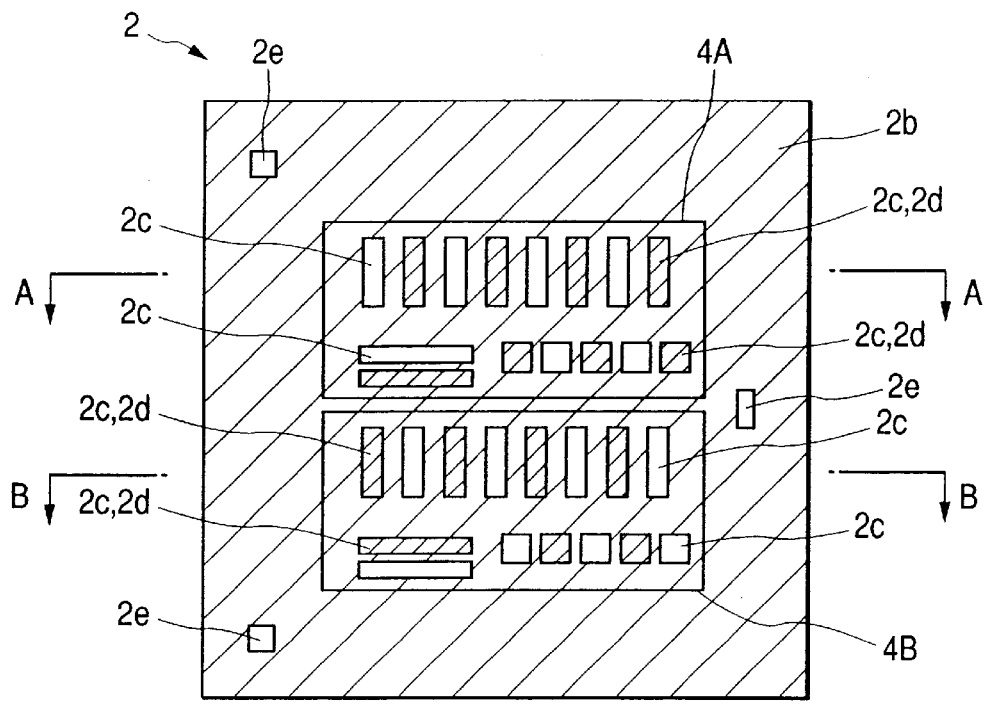
FIG. 6($a$) is an overall plan view of one example of a mask used in a method of manufacture of a semiconductor integrated circuit device according to one embodiment of the present invention, and FIG. 6($b$) and FIG. 6($c$) are cross-sectional views taken along a line A—A and a line B—B of FIG. 6($a$), respectively.
Figure 6B:
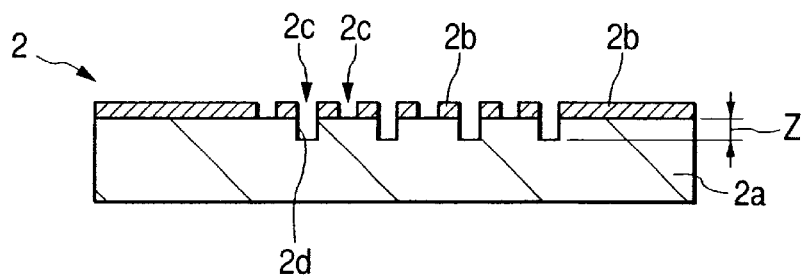
Figure 6C:
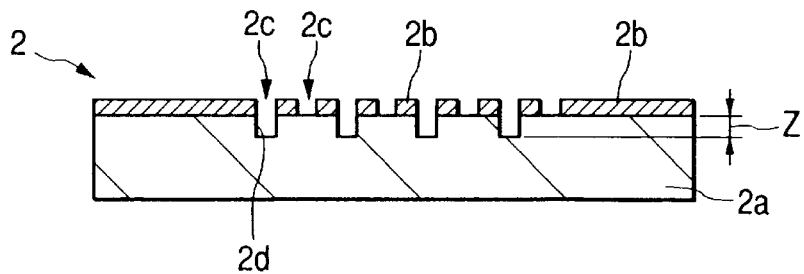

Now, one example of the mask 2 used in the embodiment 1 will be explained in conjunction with FIG. 6 to FIG. 8. FIG. 6(a) is an overall plan view of the mask 2 and FIG. 6(b) and FIG. 6(c) are cross-sectional views taken along a line A—A and a line B—B of FIG. 6(a) FIG. 7 and FIG. 8 show one example of enlarged cross-sectional views showing essential parts of the mask shown in FIG. 6(a). Although FIG. 6(a) is a plan view, hatching is provided to facilitate the understanding of the drawing.

Here, a case in which, for example, two transfer regions 4A, 4B are arranged on a main surface (same surface) of one sheet of mask 2 is illustrated. Respective transfer regions 4A, 4B are formed in a planar rectangular shape, for example, and are arranged in a spaced-apart-manner with a given distance between them such that respective sides become parallel to each other. Each transfer region 4A, 4B corresponds to a region which can transfer one semiconductor chip (the above-mentioned chip forming region) The number of transfer regions which can be arranged on one sheet of mask 2 is not limited to the above and can be changed to various numbers.

A mask substrate 2a which constitutes the mask 2 is made of a transparent synthetic quartz glass having a planar square shape, for example. Mask patterns are formed over respective transfer regions 4A, 4B over the main surfaces of the mask 2. The mask patterns are patterns for transferring given integrated circuit patterns. For example, each mask pattern is constituted by a light shielding pattern 2b which is made of chromium, chromium oxide or a laminated film made of these materials, for example, and light transmitting patterns 2c where the mask substrate 2a is partially exposed. Further, in the insides of respective transfer regions 4A, 4B, the above-mentioned groove shifter 2d is arranged in either one of light transmitting patterns 2c which are disposed close to each other. In the embodiment 1, respective mask patterns of the above-mentioned transfer regions 4A, 4B have the same shape and dimension. However, the transfer regions 4A, 4B have an opposite arrangement with respect to respective groove shifters 2d. That is, the groove shifters 2d are arranged such that, at the time of exposing the transfer regions 4A, 4B onto one region (chip forming region) of the wafer by superposition exposure, the light which has passed through given light transmitting patterns 2c of the transfer region 4A and the light which has passed through given light transmitting patterns 2c of the transfer region 4B which are superposed over the given light transmitting pattern 2c of the transfer region 4A on a plane have phases thereof inverted at 180 degrees from each other.

The depth Z of the groove shifter 2d is determined to satisfy $Z=\lambda/(2(n-1))$ for inverting the phase of the transmitting light at 180 degrees. Here, n is a refractive index of the substrate relative to the exposure light having a given wavelength and k is the wavelength of the exposure light. In the above example, since KrF having an exposure wavelength of 248 nm is used, for example, the depth Z becomes approximately 245 nm, for example. When this multiple exposure processing is not performed, the tolerance of the depth of the groove shifters 2d is approximately ±3 nm (2 degrees as a phase angle), for example, and is extremely narrow. Accordingly, the manufacturing of the masks 2 becomes extremely difficult resulting in the lowering of the yield of the masks 2. To the contrary, according to the embodiment 1, the tolerance of the depth of the groove shifters 2d can be alleviated to approximately ±4 nm to 8 nm (3 degrees to 6 degree as a phase angle), for example.

Accordingly, the ease of manufacture of the masks 2 can be largely enhanced. Further, the manufacturing yield of the masks 2 can be largely enhanced. These features will be explained in more detail later.

Further, in the transfer regions 4A, 4B, in addition to the patterns which substantially constitute the integrated circuits, patterns which do not substantially constitute integrated circuits, such as the mark patterns used for multiple exposure processing, mark patterns used for multiple inspection or mark patterns used at the time of inspecting electric characteristics, are included. Further, over the light shielding region disposed in the outer periphery of the transfer regions 4A, 4B, portions of the mask substrate 2a are exposed, thus forming other light transmitting patterns 2e, such as mask alignment marks, the marks measurement and the like.

FIGS. 7(a) to 7(c) and FIGS. 8(a) to 8(c) show an example of enlarged cross-sectional views of portions of a pair of light transmitting patterns 2c, 2c (a pair of light transmitting patterns which are disposed close to each other and the groove shifter 2d is arranged at either one of them) of the mask 2 shown in FIG. 6.

Figure 7A:
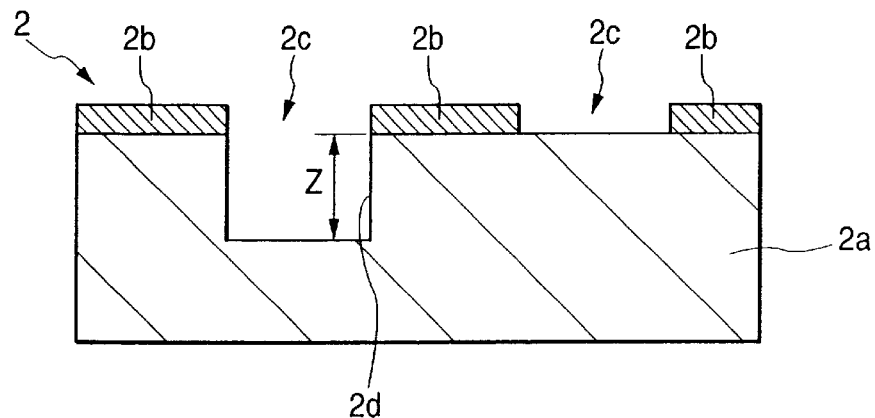
FIG. 7($a$) to FIG. 7($c$) are cross-sectional views of essential parts of various masks of FIG. 6($a$).
Figure 7B:
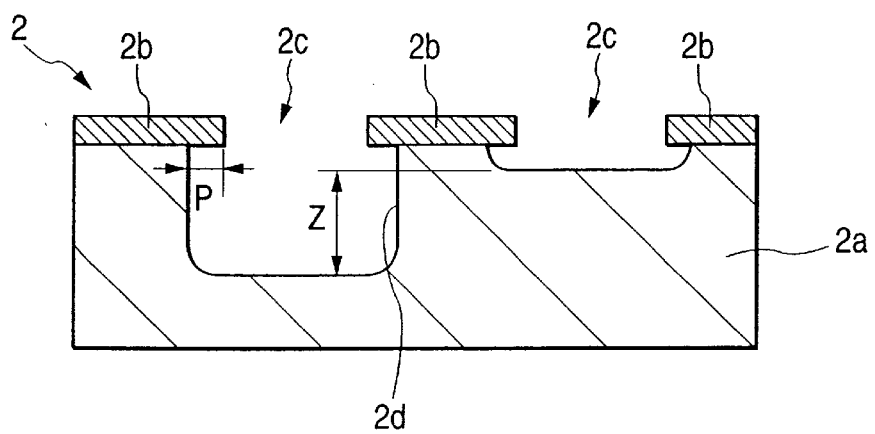
Figure 7C:
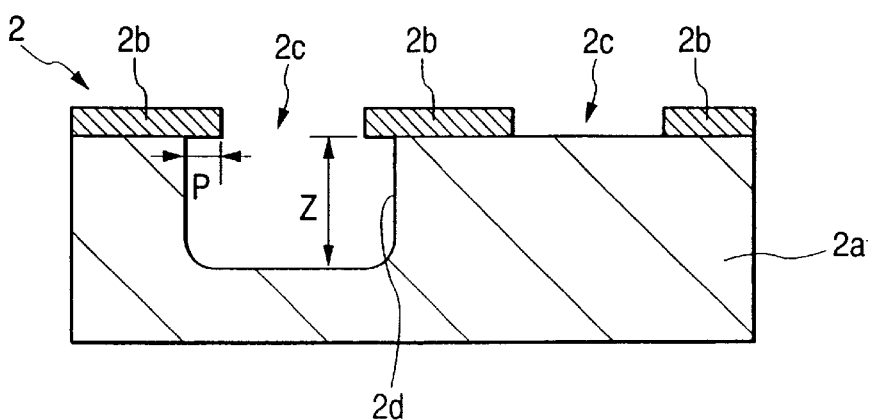

FIG. 7(a) to FIG. 7(c) show a case in which the groove shifter 2d is the above-mentioned substrate groove shifter. That is, the groove shifter 2d is formed by digging a groove having a U-shaped cross section over the surface of the mask substrate 2 per se. FIG. 7(a) shows a case in which the groove shifter 2d is not provided with an eaves structure. That is, FIG. 7(a) shows the case in which the side wall surface of the groove shifter 2d and the side wall surface of the opening portion (light transmitting pattern 2c) of the light shielding pattern 2b are approximately aligned with each other and eaves are not formed over the side end portions of the opening portion of the light shielding pattern 2b. In this case, the depth Z of the groove shifter 2d is, when the height of the pattern forming flat surface of the mask 2 is used as a reference, the length from such pattern forming flat surface to the bottom flat surface of the groove shifter 2d. According to this embodiment 1, by performing multiple exposure processing even with the mask 2 having no eaves, as shown in FIG. 7(a), the dimensional accuracy of the patterns transferred onto the wafer can be enhanced.

FIG. 7(b) and FIG. 7(c) show examples in which the groove shifter 2d is the above-mentioned fine eaves type groove shifter. That is, the groove shifter 2d has a structure in which at the peripheral sides (in the direction of cross section having narrow width) of the groove shifter 2d, a mask substrate 2a is overhung in the widthwise direction of the groove shifter 2d; and, hence, the end portions of the light shielding patterns 2b which faces the groove shifter 2d protrude like eaves. Here, when the wavelength 2, of the monochromatic exposure light is used as a reference, the eaves length P of the protruding portion of the light shielding pattern 2b is set to, for example, equal to or less than 40% (P/λ=40%) of the wavelength k of the exposure light. However, the present invention is applicable to the case in which the eaves length is set to equal to or less than 70% of the wavelength of the exposure light (for example, the case in which the eaves length is 150 nm when the wavelength of the exposure light is 248 nm). Due to such an eaves structure, a waveguide phenomenon of light can be suppressed. That is, the intensity of the transmitting light is prevented from being attenuated by the influence derived from the side walls of the groove shifter 2d. Accordingly, in this embodiment 1, in performing multiple exposure processing with the constitution of the masks 2 shown in FIG. 7(b) and FIG. 7(c), the dimensional accuracy of the patterns transferred onto the wafer can be further enhanced.

In FIG. 7(b), even in the light transmitting pattern 2c in which the groove shifter 2d is not arranged, the mask substrate 2 is dug to form a groove 2f. However, these light transmitting patterns 2c, 2c are constituted such that a phase difference of 180 degrees is set between the light which passes through the light transmitting pattern 2c in which the groove shifter 2d is arranged and the light which passes through the light transmitting pattern 2c in which the groove 2f is arranged. The groove 2f is also provided with an eaves structure. In forming the groove shifter 2d, if the light transmitting pattern 2c for which it is unnecessary to form a groove is covered by a photo resist film, a photo resist film coating step and a patterning step become necessary as additional steps. Accordingly, in the mask 2 shown in FIG. 7(b), at the time of forming the eaves structure over the groove shifter 2d, a photo resist film is not formed and the surface (pattern forming surface) of the mask substrate 2a is subjected to a wet etching using the light shielding pattern 2b as an etching mask. The groove 2f is formed along with such processing. According to this method, since the steps such as the photo resist film coating and the patterning can be eliminated, the manufacturing process of the mask 2 can be simplified. In the case of this mask 2, the depth Z of the groove shifter 2d is, when the height of the pattern forming flat surface of the mask 2 formed at the bottom of the groove 2f is used as the reference, the length from such pattern forming flat surface to the bottom flat surface of the groove shifter 2d. Further, FIG. 7(c) shows a case where the groove 2f of FIG. 7(b) is not formed. In this case, the depth of the groove shifter 2d is equal to that of FIG. 7(a). The method of manufacture of the mask 2 shown in FIG. 7(a) to FIG. 7(c) will be explained in more detail later.

Figure 8A:
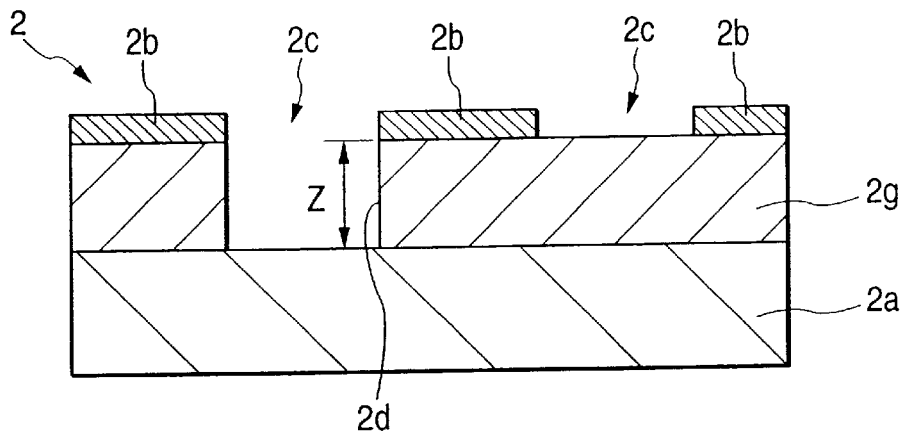
FIG. 8($a$) to FIG. 8($c$) are cross-sectional views of essential parts of various masks of FIG. 6($a$).
Figure 8B:
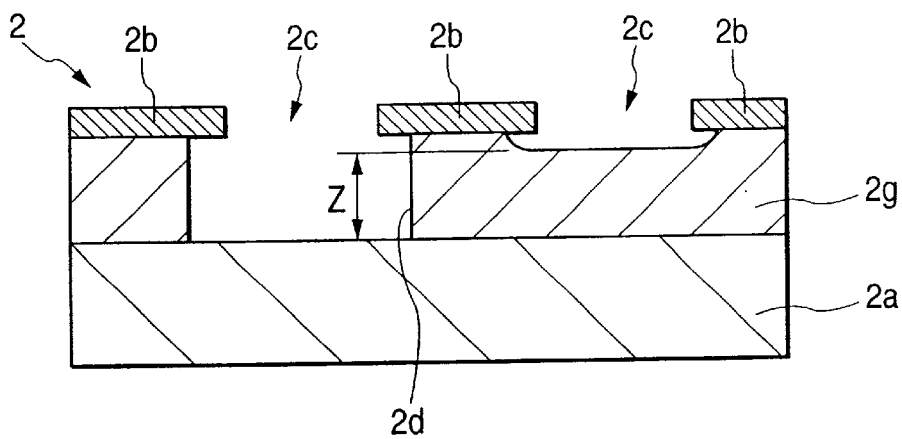
Figure 8C:
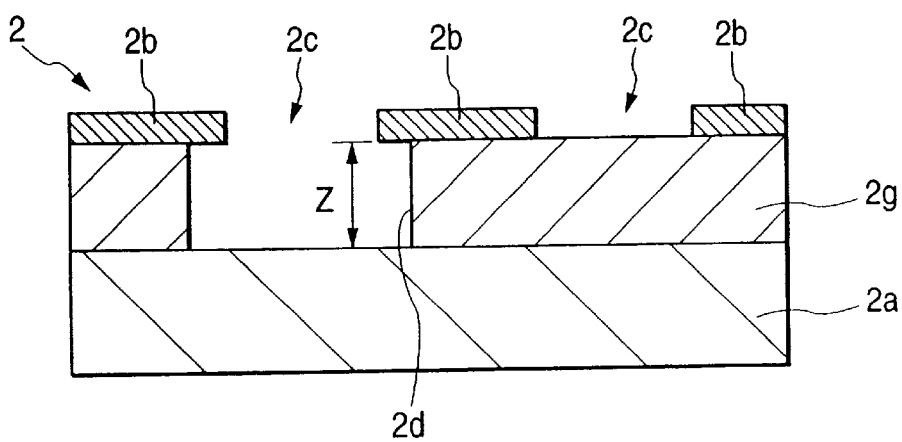

Further, FIG. 8(a) to FIG. 8(c) show examples in which the groove shifter 2d is the above-mentioned on-substrate thin film groove shifter. That is, FIG. 8(a) to FIG. 8.(c) each show a structure where a shifter film 2g is formed over the surface of a mask substrate 2a and a light shielding pattern 2b is formed over the shifter film 2g. The shifter film 2g is formed with a thickness (=the above-mentioned formula Z) which conforms with its object to function as the phase shifter. The shifter film 2g is, for example, made of SOG (Spin On Glass) or the like having a light transmittance and a refractive index equivalent to or equal to those of the mask substrate 2a. The groove shifter 2d is formed by removing the shifter film 2g corresponding to a given light transmitting pattern 2c until the surface of the mask substrate 2a is exposed. In this case, in forming the groove shifter 2d, the etching speed of the shifter film 2g is made faster than the etching speed of the mask substrate 2a by increasing the etching selection ratio between the mask substrate 2a and the shifter film 2g. That is, the groove shifter 2d is formed by using the mask substrate 2a as an etching stopper. Due to such a constitution, the depth of the groove shifter 2d (that is, the thickness of the shifter film 2g) and the flatness of the bottom surface of the groove shifter 2d can be formed with an extremely high accuracy. Accordingly, the phase error of the transmitting light can be largely reduced or eliminated; and, hence, the dimensional accuracy of the patterns transferred onto the wafer can be remarkably enhanced. FIG. 8(a) to FIG. 8(c) respectively correspond to FIG. 7(a) to FIG. 7(c). That is, FIG. 8(a) shows a structure having no eaves structure, FIG. 8(b) shows a structure in which the eaves and the groove 2f are formed, and FIG. 8(c) shows a structure in which only the eaves are formed and no groove 2f is formed.

Figure 9:
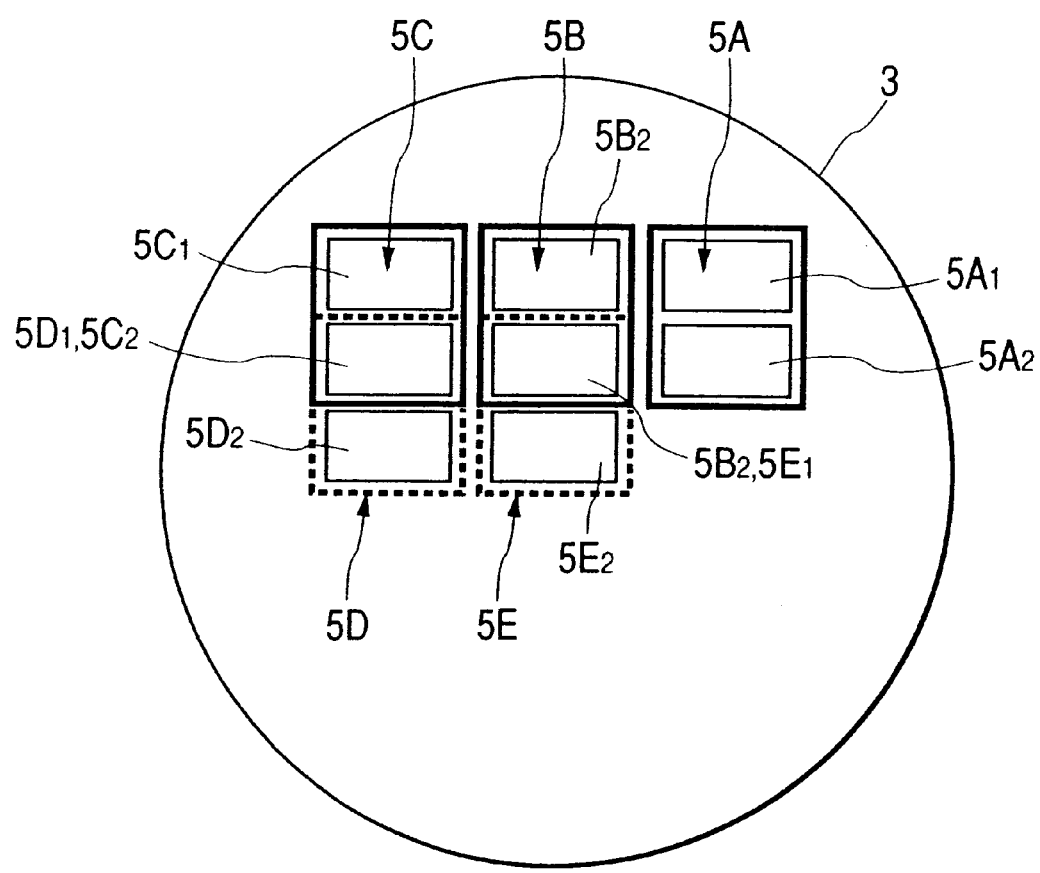
FIG. 9 is a diagram illustrating an exposure processing step in a method of manufacture of a semiconductor integrated circuit device according to one embodiment of the present invention.

One example of a multiple exposure method according to the embodiment 1 will be explained in conjunction with FIG. 9. FIG. 9 is an overall plan view of the wafer 3 and illustrates a step-and-scan exposure processing for transferring given integrated circuit patterns over the main surface (coated with the photo resist film) of the wafer 3 using the mask 2 (see FIG. 6) and the scanner 1 (see FIG. 1).

The exposure condition is the same as the exposure condition explained with reference to the above-mentioned exposure apparatus 1. Over the main surface of the wafer 3, an insulation film (a silicon oxide film) having a thickness of, for example, approximately 200 nm is formed. Further, over the insulation film, a positive-type photo resist film having a thickness of, for example, approximately 500 nm is stacked. An exposure amount to this photo resist film is set to, for example, 25 mJ/cm$^2$, and is adjusted to, for example, 50 mJ/cm$^2$ by a superposition exposure. The minimum pattern in the mask 2 is, for example, lines and spaces of 150 nm when converted over the wafer 3.

First of all, the transfer regions 4A, 4B of the mask 2 are transferred to a region SA over the wafer 3 by the above-mentioned scanning exposure method. That is, while holding the main surfaces of the mask 2 and the wafer 3 parallel to each other, the mask 2 and the wafer 3 are moved in opposite directions (upper and lower longitudinal direction in FIG. 9) so as to move the above-mentioned slit-like exposure region over the main surface of the wafer 3, and the mask patterns (integrated circuit patterns) in the transfer regions 4A, 4B of the mask 2 are transferred to the region SA over the main surface of the wafer 3. Transfer regions SA1, SA2 of the region SA over the wafer 3 are respectively formed of regions to which the transfer regions 4A, 4B of the mask 2 are transferred. Here, the transfer regions SA1, SA2 correspond to chip forming regions.

Subsequently, the wafer 3 is horizontally moved in the right direct-ion in FIG. 9 and the regions SB, SC are sequentially exposed in the same manner as mentioned above. Exposure amounts at these regions 5A, 5B, SC are set to approximately ½ of the necessary amount. Transfer regions 5B1, SC1 in respective regions 5B, SC are identical with the transfer region 5A1 and transfer regions SB2, SC2 in respective regions 5B, SC are identical with the transfer region 5A2.

Subsequently, the wafer 3 is moved in the upper direction in FIG. 9 by one unit of the transfer region 5A1, 5A2, for example, and then the region 5D is exposed in the same manner as mentioned above. Here, in this embodiment 1, the transfer region 5D1 in the region 5D and the transfer region 5C2 in the region 5C, which have been already transferred previously, are superposed with each other on a plane. That is, to the transfer region 5C2 where the transfer region 4B of the mask 2 has been already transferred, the transfer region 4A of the same mask 2 is transferred by superposition exposure on a plane. As mentioned previously, the respective lights which pass through the same planar position of the transfer regions 4A, 4B of the mask 2 have their phases inverted at 180 degrees from each other.

Then, the wafer 3 is horizontally moved in the left direction in FIG. 9 and the region 5E is exposed sequentially in the same manner as mentioned above. Here, the transfer region 5E1 in the region 5E and the transfer region 5B2 in the region 5B, which have been already transferred previously, are superposed with each other on a plane. That is, to the transfer region 5B2, where the transfer region 4B of the mask 2 has been already transferred, the transfer region 4A of the same mask 2 is transferred by superposition exposure on a plane. Here, as mentioned previously, the respective lights which pass through the same planar position of the transfer regions 4A. 4B of the mask 2 also have their phases inverted at 180 degrees from each other.

Exposure amounts at the regions 5D, 5E are set to ½ of the necessary amounts. Accordingly, at places where regions are superposed (the transfer regions 5B2, SE1 and the transfer regions SC2, SD1 and the like) from the region SA to the region 5E, the exposure amount becomes the necessary amount. Transfer regions 5D1, 5E1 in respective regions 5D, 5E are identical with the transfer region 5A1 and transfer regions 5D2, 5E2 are identical with the transfer region 5A2.

By repeating such a multiple exposure processing operation over the entire surface of the wafer 3, integrated circuit patterns for a plurality of chip forming regions are transferred onto the wafer 3. Here, the transfer region 4A and the transfer region 4B of the mask 2 are made to be superposed with each other. That is, although the mask patterns are identical, the exposure is performed by superposing the transfer regions 4A, 4B which arrange the groove shifters 2d such that the transmitting lights have their phases inverted from each other. Due to such an exposure processing, the dimensional accuracy of the patterns transferred onto the wafer 3 can be enhanced.

Further, in the above-mentioned explanation, the transfer regions 5A1, 5B1, 5C1 of the transfer regions 5A, 5B, 5C disposed at the outermost periphery of the wafer 3 are not subjected to superposition exposure. However, with respect to these portions, superposition exposure can be performed by shielding the light against the transfer region 4A of the mask 2 by means of a masking blade, for example, and then performing the transfer such that the transfer region of the transfer region 4B is transferred to the transfer region 5A1 of the wafer 3 in FIG. 9 by superposition exposure on a plane. The same goes for the transfer regions 5B1, 5C1.

The operation of the multiple exposure processing of this embodiment 1 will be explained in conjunction with technical problems which the inventors have reviewed for making the present invention.

Figure 10A:
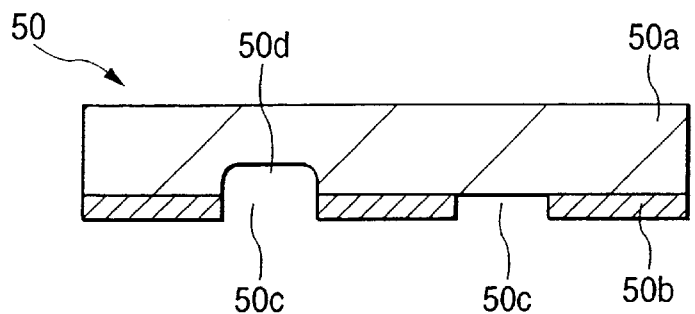
FIG. 10($a$) is a partial cross-sectional view of a phase shift mask which the inventors of the present invention have reviewed.

First of all, the technical problems that the inventors have reviewed will be explained with reference to FIGS. 10(a) to 10(c). FIG. 10(a) shows the cross-sectional shape of a phase shift mask 50. The phase shift mask 50 includes a mask substrate 50a, a light shielding pattern 50b formed over a main surface of the mask substrate 50a and light transmitting patterns 50c. The light shielding pattern 50b is made of chromium or the like, for example. On one of the light transmitting patterns 50c which are disposed close to each other, a groove shifter 50d is formed by digging the mask substrate 50a to a given depth for generating the phase difference of 180 degrees between the lights which pass through these light transmitting patterns 50c. Here, as an example, the groove shifter 50d is made of a substrate groove shifter. A fine eaves type groove shifter is not used. Further, the light transmitting patterns 50c, which are disposed close to each other, have the same planar shape and dimension.

Figure 10B:
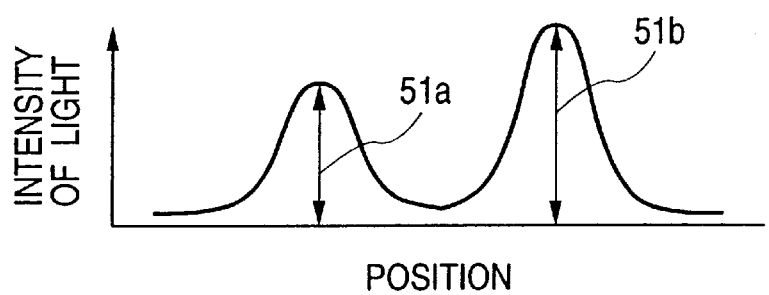
Figure 10C:
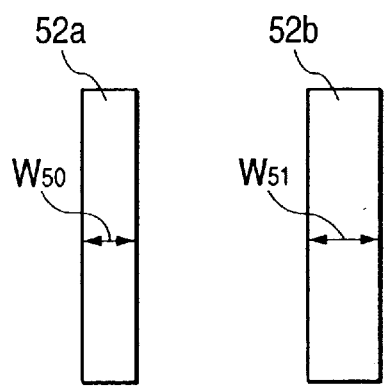

When projection exposure is performed using this phase shift mask 50, with respect to the intensity of light obtained on a substrate to be projected, as shown in FIG. 10(b), the intensity 51a of the light which has passed through the light transmitting patterns 50c provided with the groove shifter 50d becomes smaller than the intensity 51b of light which has passed through the light transmitting pattern 50cprovided with no groove shifter 50d. This is believed to result from the fact that the intensity of the transmitting light is alleviated due to the influence of side walls of the groove shifter 5d dug into the mask substrate 50a. Accordingly, when the pattern is transferred to the photo resist film by the usual method (single exposure), as illustrated by an exposed plane shown in FIG. 10(c), the widthwise dimension w50 of a photo resist pattern 52a to which the light transmitting pattern 50c provided with the groove shifter 50d is transferred becomes smaller than the widthwise dimension w51 of a photo resist pattern 52b to which the light transmitting pattern 50c provided with no groove shifter 50d is transferred. That is, the plane dimensions of the photo resist patterns 52a, 52b which originally should have the same dimension become different due to the presence or non-presence of the groove shifter 50d.

Figure 11A:
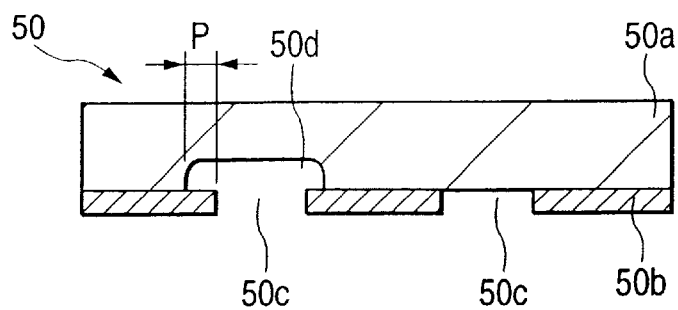
FIG. 11($a$) is a partial cross-sectional view of another phase shift mask which the inventors of the present invention have reviewed.
Figure 11B:
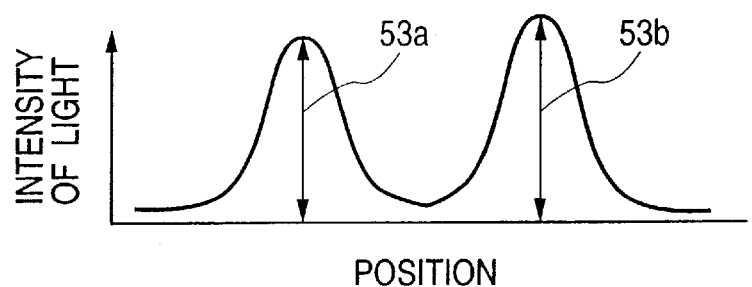
Figure 11C:
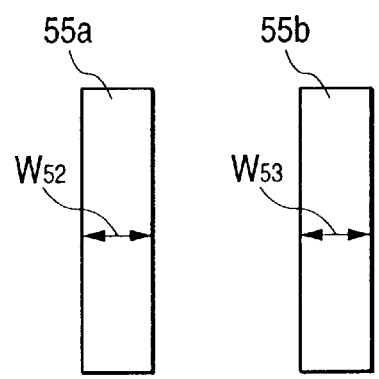

To prevent this phenomenon, as shown in FIG. 11(a), a technique which provides the groove shifter 50d with the above-mentioned fine eaves type groove shifter structure is adopted. That is, the groove shifter 50d of the mask substrate 50a is adjusted such that the side walls of the groove shifter 50d are hidden beneath the light shielding pattern 50b and end portions of the light shielding pattern 50b are overhung like eaves by an eaves length P. Due to such a constitution, as shown in FIG. 11(b), the intensity 53a of the light which has passed through the light transmitting patterns 50c provided with the groove shifter 50d becomes substantially equal to the intensity 53b of light which has passed through the light transmitting pattern 50c provided with no groove shifter 50d. However, under the present situation, they cannot be made completely equal. Accordingly, as illustrated by an exposed plane shown in FIG. 11(c), although the widthwise dimension w52 of a photo resist pattern 55a to which the light transmitting pattern 50c provided with the groove shifter 50d is transferred becomes substantially equal to the widthwise dimension w53 of a photo resist pattern 55b to which the light transmitting pattern 50c provided with no groove shifter 50d is transferred, they cannot be made completely equal.

Figure 12:
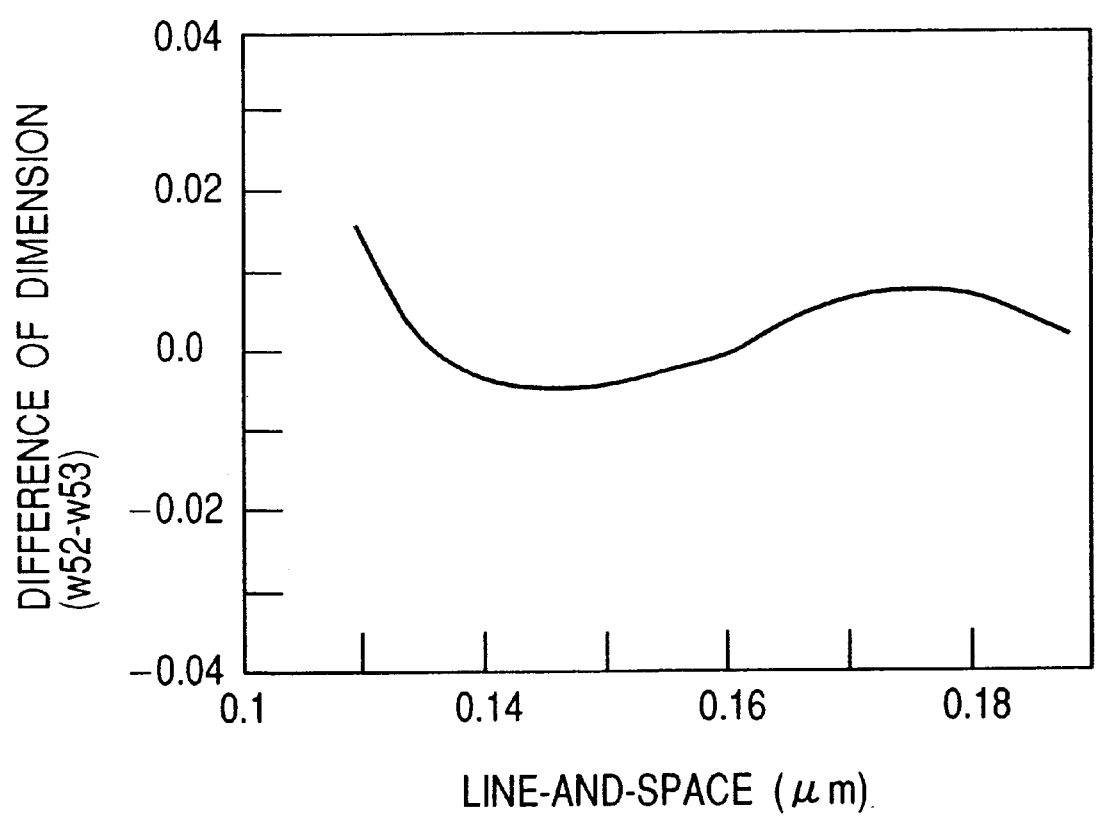
FIG. 12 is a graph showing the relationship between the line-and-space (pattern) dimension and the difference of dimensions of the transfer patterns at respective dimensions in the exposure processing using the phase shift mask which the inventors of the present invention have reviewed.

Here, the inventors of the present invention have carried out investigations and researches in a further extensive manner. FIG. 12 shows the result of such investigations and researches. The dimension of lines and spaces (pattern) is taken on the axis of abscissas and the variation of tolerance (w52–w53) of the photo resist patterns 55a, 55b at respective dimensions is taken on the axis of ordinates. Here, the pattern transfer condition is as follows, for example. That is, the eaves length P is set to 100 nm, for example. The dimension of the resolution pattern is varied from 0.12 $\mu$m to 0.18 $\mu$m. The exposure condition is the same as the condition explained with reference to the above-mentioned exposure apparatus 1. As a result, it is found that, corresponding to the dimensional values of the pattern to be formed over the wafer, the difference between the dimensions w52, w53 of the photo resist patterns 55a, 55b becomes different. Accordingly, it was found that it is difficult to eliminate the variation of the tolerance of patterns transferred onto the wafer by merely providing the groove shifter with an eaves structure.

Accordingly, in this embodiment 1, the mask patterns of the mask 2 are transferred onto the wafer 3 by multiple exposure processing as mentioned above. Here, the multiple exposure processing is performed such that the arrangement of the groove shifters 2d of the mask patterns to be subjected to the multiple exposure process are inverted from each other. Due to such a constitution, with respect to the patterns which are transferred onto the wafer 3, the variation of the tolerance of the transfer patterns due to the absolute error of phases, the variation of tolerance of the transfer patterns due to the presence or non-presence of the groove shifters 2d or the variation of the tolerance of the transfer patterns due to the difference of dimensions of patterns to be formed over the wafer, can be reduced or eliminated; and, hence, the dimensional accuracy of the transfer patterns can be enhanced, and it becomes possible to make the dimensions of the transfer patterns uniform.

Figure 13:
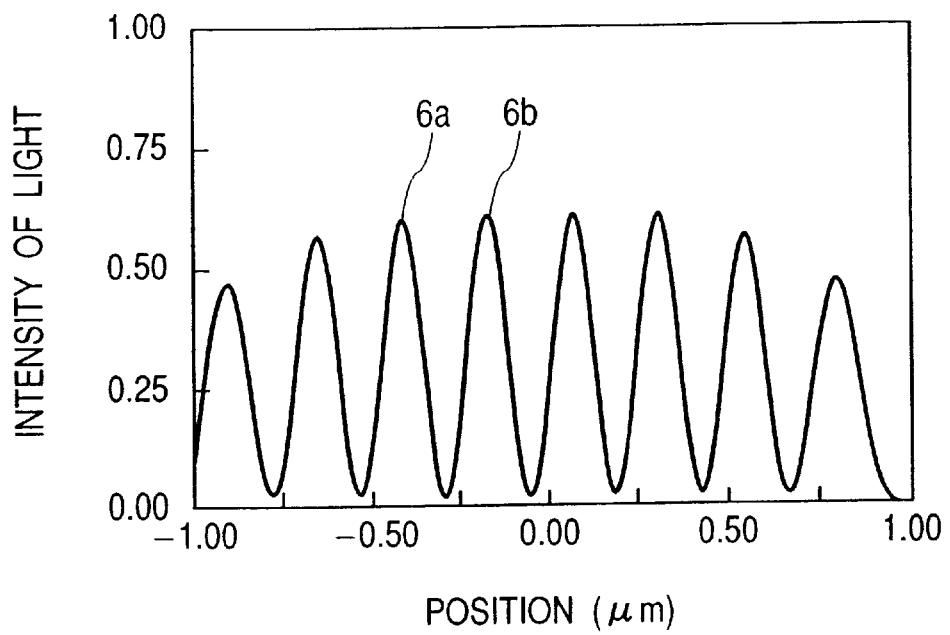
FIG. 13 is a graph obtained by simulating the distribution of the intensity of light of the exposure processing in a method of manufacture of semiconductor integrated circuit devices according to one embodiment of the present invention.
Figure 14:
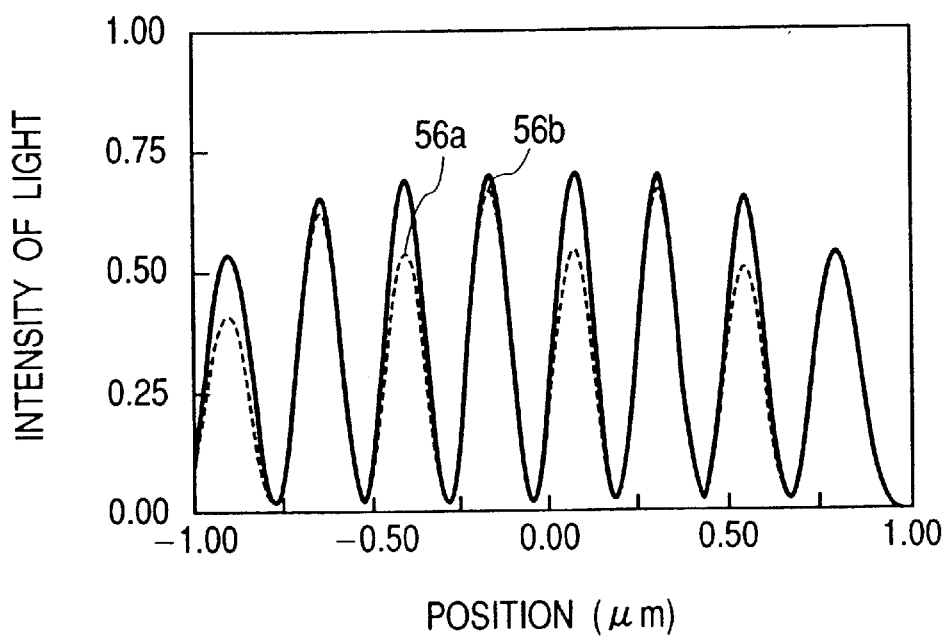
FIG. 14 is a graph obtained by simulating the distribution of the intensity of light of the exposure processing which the inventors of the present invention have reviewed.

The result obtained by examining the effects of multiple exposure of the above-mentioned embodiment 1 by a simulation is shown in FIG. 13. Further, for comparison purposes, the result of a single exposure is shown in FIG. 14. Both drawings show the distribution of the intensity of light obtained over the wafer. Further, in both exposure processing operates, a phase shift mask having the usual groove shifter (excluding the fine eaves type groove shifters) structure is used.

As can be understood from FIG. 13, according to this embodiment 1, it was found that since the, transfer regions 4A, 4B which are disposed such that their groove shifters 2d are inverted from each other are subjected to superposition exposure, the light intensity peaks 6a, 6b which are disposed close to each other can obtain a uniform intensity of light. To the contrary, in case of the single exposure, as shown in FIG. 14, was is found that the intensity 56a of the light which passed through the light transmitting pattern provided with the groove shifter is smaller than the intensity 56b of the light which passed through the light transmitting pattern provided with no groove shifter.

Figure 15A:
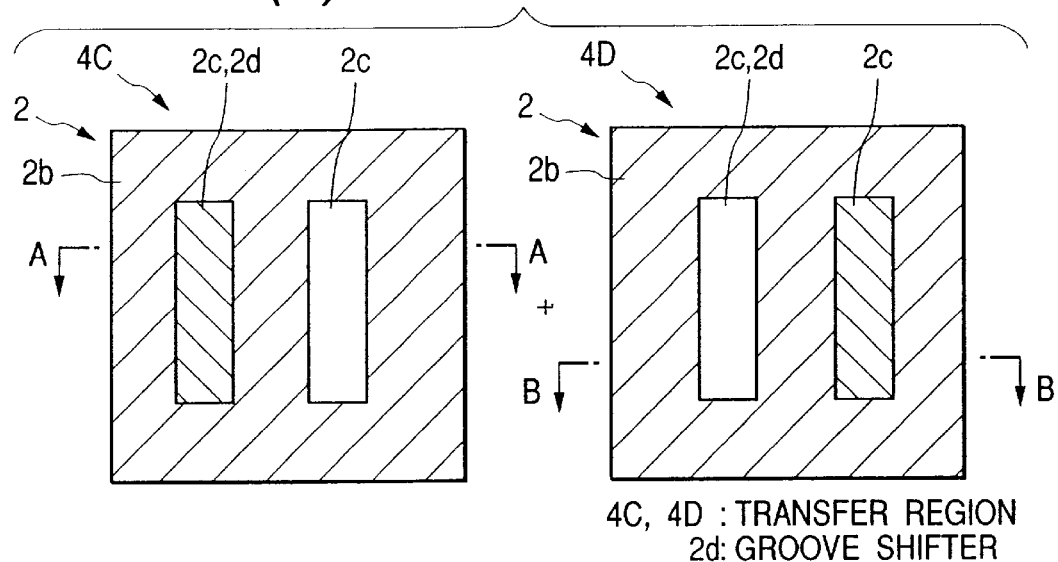
FIG. 15($a$) is a plan view of two transfer regions where masks used in an exposure processing in a method of manufacture of semiconductor integrated circuit devices according to one embodiment of the present invention are superposed.
Figure 15B:
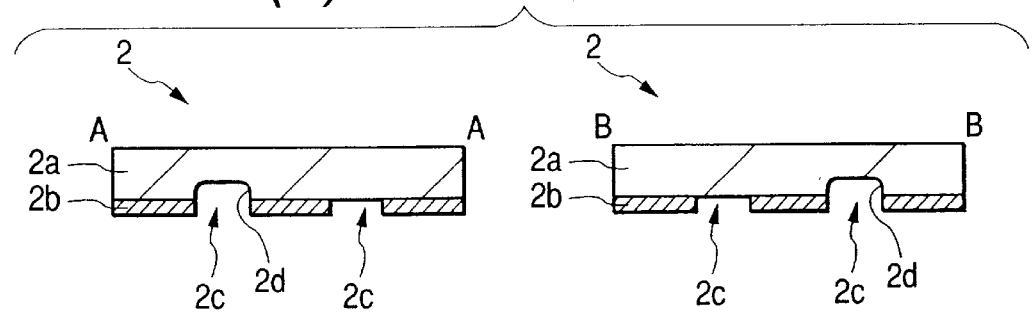
Figure 15C:
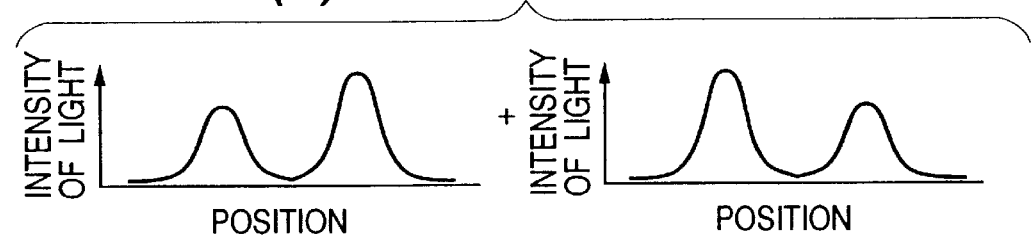
Figure 15D:
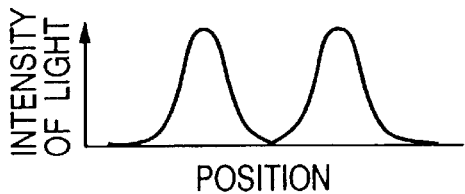

FIGS. 15(a) to 15(d) schematically show the operation of the multiple exposure processing of this embodiment 1 in a simplified manner. FIG. 15(a) shows two transfer regions 4C, 4D of the mask 2 which are superposed, and FIG. 15(b) shows cross-sectional views taken along a line A—A and a line B—B of FIG. 15(a). On respective transfer regions 4C, 4D, strip-like light transmitting patterns 2c, 2c which are disposed close to each other are formed. The plane shapes and dimensions of the light transmitting patterns 2c, 2c of the transfer regions 4C, 4D are made equal. In both transfer regions 4C, 4D, although the shifter groove 2d is arranged at either one of the neighboring light transmitting patterns 2c, the shifter groove 2d is arranged such that, when the transfer region 4C and the transfer region 4D are superposed, the transfer regions 4C, 4D become opposite to each other, that is, the phases of the transmitting lights are inverted from each other at 180 degrees. FIG. 15(c) shows the distribution of the intensity of the lights which passed through respective transfer regions 4C, 4D. In the distribution of the intensity of lights which have passed through respective transfer regions 4C, 4D, in both of them, the intensity of the light which have passed through the light transmission patterns 2c provided with the groove shifter 2d is alleviated. To the contrary, FIG. 15(d) shows the distribution of the intensity of transmitting light when the exposure is performed by superposing the transfer regions 4C, 4D. In this case, since the light which passed through the light transmitting pattern 2c provided with the groove shifter 2d and the light which passed through the light transmitting pattern 2c provided with no groove shifter 2d are exposed to the same place by superposition exposure, the intensities of light of both transfer regions can be made uniform. Accordingly, an imbalance in the intensity of the light can be cancelled so that the distribution of intensity of the light can be made uniform.

In this manner, according to the multiple exposure processing of this embodiment 1, even if the absolute value accuracy (error accuracy) of phases is slightly bad, the resolution characteristics which are equal to resolution characteristics obtained when the phase difference is exactly at 180 degrees can be obtained. That is, the tolerance in the error of the phases (absolute accuracy of phases) can be alleviated to 3 to 6 degrees(±4 nm to±8 nm when expressed by the depth of the groove shifter 2d), for example. Accordingly, the ease of manufacture of the masks 2 can be remarkably enhanced. Further, it also becomes possible to largely enhance the manufacturing yield of the masks 2. Particularly, this embodiment 1 forms the transfer regions 4A, 4B to be superposed to different planar positions in the same plane of the same mask 2. Accordingly, compared to a case where the transfer regions to be superposed are formed over separate masks, the depth of the groove shifter 2d and the error amount can be made approximately uniform within the plane of the mask 2. Therefore, compared to a case where the transfer regions to be superposed are formed over separate masks, the masks 2 can be easily manufactured, while ensuring a relatively higher absolute value accuracy of the phases.

Further, according to the multiple exposure processing of this embodiment 1, it becomes possible to suppress or prevent a phenomenon in which the dimensions of the transfer patterns which are disposed close to each other fluctuate due to the presence or non-presence of the groove shifter 2. Accordingly, the dimensional accuracy of the patterns to be transferred can be remarkably enhanced. Further, since the fluctuation of the dimension of the neighboring transfer patterns due to the presence or non-presence of the groove shifter 2 can be reduced or prevented, it is unnecessary to provide the groove shifter 2 with a fine eaves type groove shifter structure. Accordingly, it becomes possible to remarkably enhance the ease of manufacture of the masks 2. Although the eaves structure can obtain the greater effect as the eaves length becomes longer, since the light shielding patterns 2b over the mask 2 must be finer along with the increase of the demand for the refinement of the patterns over the wafer, the increase of the eaves length is restricted. Since the technique of this embodiment 1 can enhance the dimensional accuracy of patterns without adopting the eaves structure, the technique is suitable for the refinement of the patterns.

Further, according to the multiple exposure processing of the embodiment 1, it becomes possible to suppress or prevent a phenomenon in which the difference of dimensions of the transfer patterns which are disposed close to each other fluctuate in response to the dimension of the patterns to be transferred onto the wafer 3. Accordingly, the dimensional accuracy of the patterns which are transferred onto the wafer 3 can be enhanced in all transfer regions.

The result obtained by actually transferring the patterns shows that a pattern of 150 nm could be favorably formed over the entire surface of a chip with an accuracy of 150 nm±10 nm. Further, no special propensity was found with respect to the resolution dimension of the neighboring patterns. The occurrence of short-circuiting of patterns or the like, which may be caused by defects of the mask 2, also could not be found. On the other hand, under the same condition, using a technique which does not perform superposition exposure, a pattern of 150 nm was formed over the entire surface of a chip with an accuracy of 150 nm±22 nm. Further, the difference of the resolution dimension between the pattern provided with the groove shifter and the pattern provided with no groove shifter was 8 nm and the pattern provided with the groove shifter was formed thinner.

Another problem which the inventors of the present invention have reviewed will be explained hereinafter. That is, in the transfer of patterns using a projection optical system, due to the various aberrations of a projection lens, there arises a distortion in a projected image. This phenomenon differs depending on the position of the projection surface. As a typical aberration, there is a distortion of a transferred image, for example. This is a displacement of the position of the projected pattern. For example, a pattern arranged in an absolute lattice is distorted in a bobbin shape or a in a barrel shape and is transferred. That is, usually, since the projection lens has various aberrations, it is difficult to form the pattern as designed.

Figure 16:
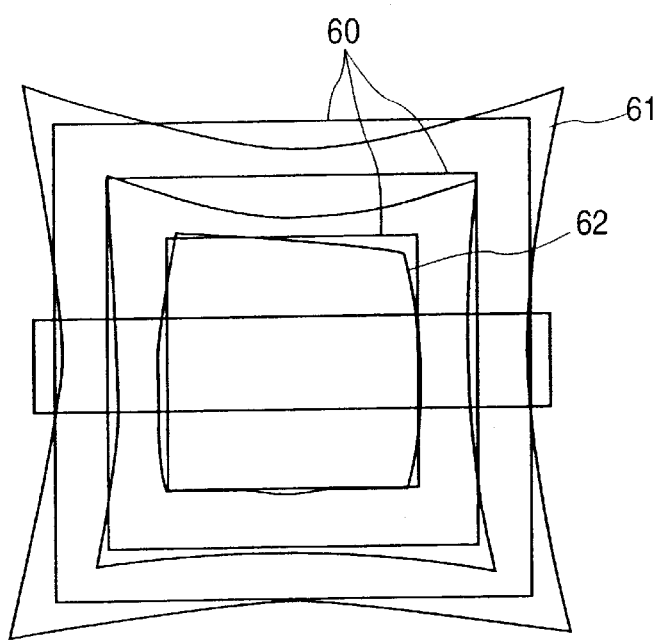
FIG. 16 is a diagram schematically showing a technique which the inventors of the present invention have reviewed where a displacement occurs on the transfer pattern when the exposure processing is performed using a stepper.

Here, in the transfer of patterns using a stepper, when a plurality of integrated circuit patterns are transferred by one shot and a multiple exposure is performed by a shifting exposure, a superposition error is generated due to the influence of the positional distortion of the patterns so that the resolution characteristics are largely deteriorated. Accordingly, the use of stepper is difficult in practice. FIG. 16 schematically shows such a state. The explanation is directed to the transfer of patterns by a stepper as an example. Numeral 60 indicates a design pattern on a theoretical lattice and forms a pattern of a quadrangular shape having no distortions. Further, numerals 61, 62 indicate transfer patterns which are actually transferred. The transfer pattern 61 is transferred while being displaced like a bobbin relative to the theoretical lattice, and the transfer pattern 62 is transferred while being displaced like a barrel relative to the theoretical lattice. In this manner, the aberration of the projection lens gives rise to the positional displacement of the patterns and its behavior differs depending on the transfer position.

Figure 17A:
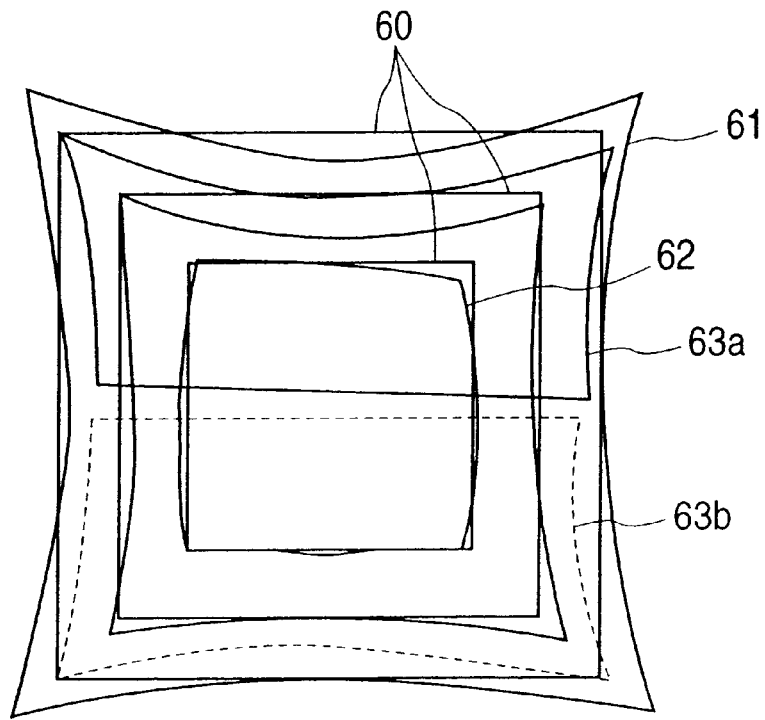
FIGS. 17($a$) and 17($b$) are diagrams schematically showing a technique reviewed by the inventors of the present invention where the manner in which transfer regions having different planar position coordinates on a photo mask are transferred by using a stepper.
Figure 17B:
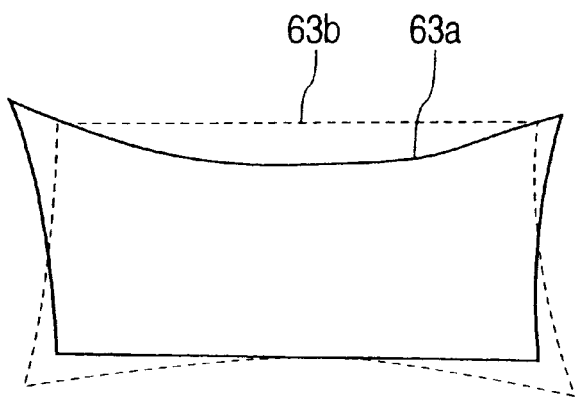

Further, FIG. 17(a) and FIG. 17(b) show the state in which transfer regions arranged at different planar position coordinates on a mask are transferred using a stepper. In FIG. 17(a) and FIG. 17(b) numerals 63a, 63b schematically indicate the entire positional displacement of transfer regions when the transfer regions constituted by the same pattern at different planar positions over the above-mentioned mask are actually transferred. As shown in FIG. 17(a), since the transfer regions 63a, 63b are formed (transferred) in different shapes from each other, when both of them are superposed as shown in FIG. 17(b), it gives rise to the positional displacement of the patterns, and, hence, it is difficult to form (transfer) the favorable patterns.

Accordingly, in this embodiment 1, as mentioned above, at the time of transferring the mask patterns over the mask 2 onto the wafer 3 using the scanner, the same patterns over the mask 2 are exposed to the same region of the wafer 3 by multiple exposure. In the exposure processing using the scanner, the patterns over the mask 2 are transferred onto the wafer 3 through a slit. In this case, the distribution of aberration becomes uniform in the scanning direction. That is, even when the superposition exposure is performed in the scanning direction, a superposition error which may be caused by the aberration is not generated. Accordingly, the superposition exposure becomes possible.

Figure 18:
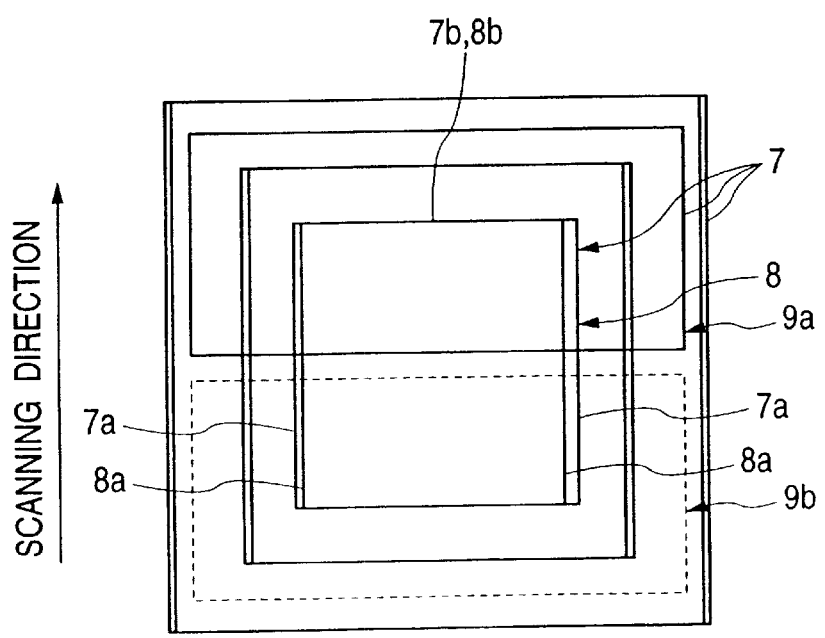
FIG. 18 is a diagram schematically showing a technical concept of the present invention where the manner in which transfer regions having different planar position coordinates on a photo mask are transferred by using a scanner.

The transferred state of patterns by using the scanner is shown in FIG. 18. Numeral 7 indicates a design pattern on a theoretical lattice and this design pattern has a quadrangular shape having no distortion. Numeral 7a indicates sides of the design pattern 7 which are parallel to the scanning direction (up and down-longitudinal direction in FIG. 18), and numeral 7b indicates sides of the design pattern 1 which are perpendicular to the scanning direction. Here, the scanning direction is a scanning direction of the projection lens, and a substrate to be subjected to an exposure processing such as a wafer 3 or the like moves in the opposite direction. Numeral 8 indicates a transfer pattern which is actually transferred. Numeral 8a indicates sides of the transfer pattern 8 which are parallel to the scanning direction, and numeral 8b indicates sides of the transfer pattern 8 which are perpendicular to the scanning direction. Further, numerals 9a, 9b schematically indicate the entire state of transfer regions to which transfer regions 4A, 4B constituted by the same pattern at different planar positions over the mask 2 are actually transferred.

In the exposure processing using the scanner, although the positional displacement derived from the lens aberration is generated in the direction (left and right lateral direction in FIG. 18) perpendicular to the scanning direction, the lens aberration becomes equal in the scanning direction, and, hence, the same shape can be maintained. For example, in the transfer pattern 8, although the sides 8a which are parallel to the scanning direction in the design pattern 7 appear to have a positional displacement relative to the sides 7a parallel to the scanning direction, the displacement amount is equal in the scanning direction. Further, in the transfer pattern 8, the sides 8b which are perpendicular to the scanning direction are substantially superposed with the sides 7b of the design pattern 7 which are disposed perpendicular to the scanning direction in the design pattern, and, hence, no positional displacement is recognized. That is, in the exposure processing using the scanner, the patterns in the transfer regions 9a, 9b have substantially the same deformation in the direction perpendicular to the scanning direction and are substantially formed in the same shape in the scanning direction. Accordingly, when the transfer regions 9a, 9b are exposed onto the same region over the substrate which is subjected to an exposure processing such as the wafer 3 or the like by superposition exposure, they can be formed with a high superposing accuracy. The present invention makes use of this feature.

Figure 19A:
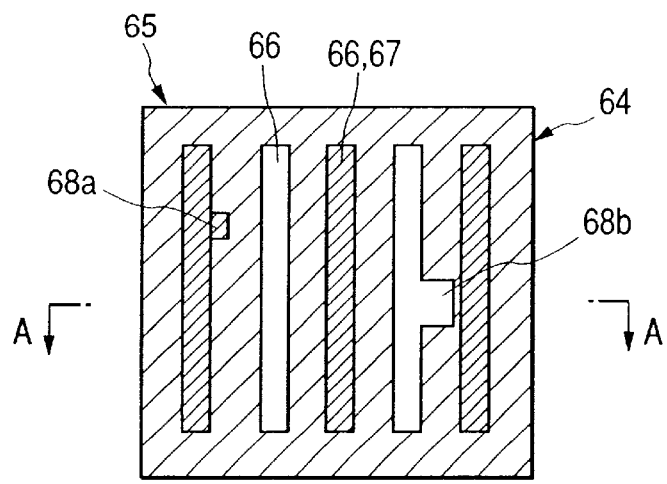
FIG. 19($a$) is a plan view of an essential part of a transfer region of a mask.
Figure 19B:
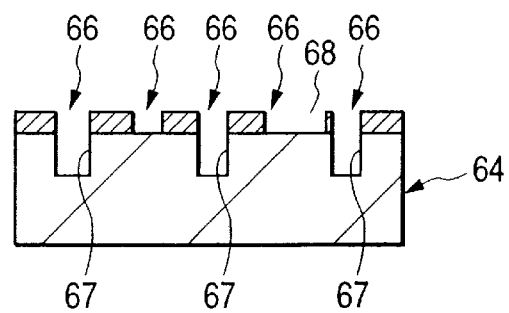

Still another problem which the inventors of the present invention have reviewed will be explained. FIG. 19(a) is a plan view showing an essential part of a mask 64 in which groove shifters 67 are formed, and FIG. 19(b) is a cross-sectional view taken along a line A—A of FIG. 19(a).

In a transfer region 65, lines and spaces of, for example, 150 nm are arranged. A groove shifter 67 is arranged in one of the light transmitting patterns 66 which are disposed close to each other. Defects 68a, 68b are present in this transfer region 65. The plane dimension of the defect 68b is larger than the planar dimension of the defect 68a.

Figure 19C:
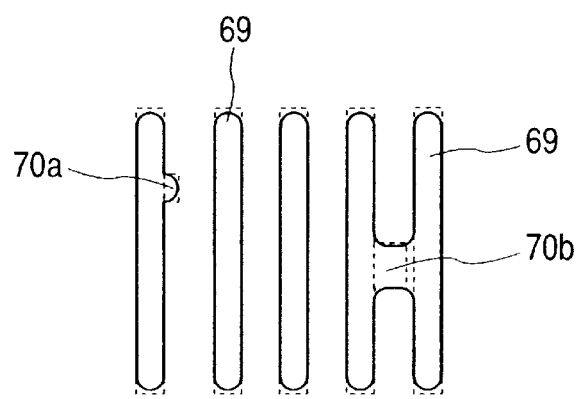

The result of scanning exposure of such a transfer region 65 without using superposition exposure processing (that is, a single exposure) is shown in FIG. 19(c). In this case, besides normal photo resist patterns 69, photo resist residues 70a, 70b derived from the defects 68a, 68b of the mask 64 are also transferred out of these photo resist residues 70a, 70b, the photo resist residues 70b became the cause of the short circuiting between the patterns. A dashed line in FIG. 19(c) indicates the light transmitting patterns 66 and the defects 68a, 68b so as to facilitate a understanding of the relative positional relationship between the photo resist patterns 69 and the photo resist residue 70b, and the light transmitting patterns 66 and the defects 68a, 68b formed over the mask 64.

Figure 20A:
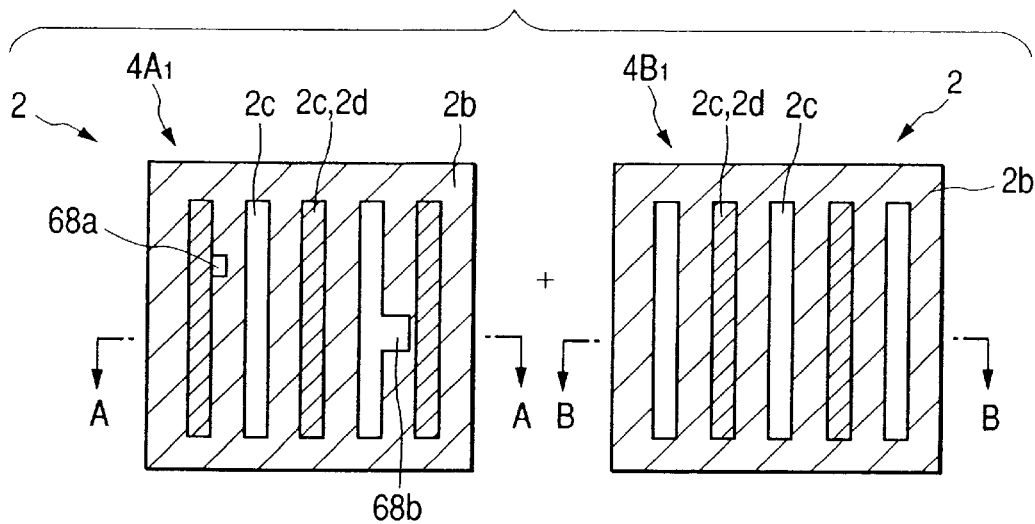
FIG. 20($a$) is a plan view of an essential part of two transfer regions of a mask.
Figure 20B:
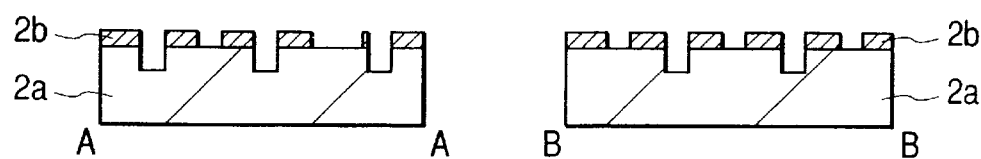
Figure 20C:
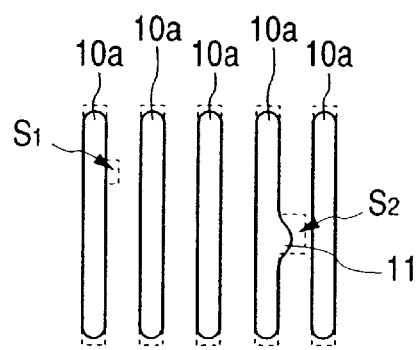

To the contrary, by performing the above-mentioned superposition exposure method of the embodiment 1, the result shown in FIGS. 20(a) to 20(c) is obtained. FIG. 20(a) is a plan view of the transfer regions 4A1, 4B2 formed at different planar positions over the same plane of the same mask 2. FIG. 20(b) shows cross-sectional views taken along a line A—A and along a line B—B of FIG. 20(a). Although the mask patterns which are identical with each other are arranged in the transfer regions 4A1, 4B1, the arrangement of the groove shifters 2d are disposed opposite to each other as mentioned above (their phases being inverted at 180 degrees) The above-mentioned defects 68a, 68b are present in the transfer region 4A1. The dimensions of lines and spaces are the same as those of the mask shown in FIG. 19. Here, in the exposure processing of this embodiment 1, since the above-mentioned transfer regions 4A1, 4B1 are respectively exposed with ½ the exposure amount by superposition exposure, the defective portion and the portion having no defect are exposed by multiple exposure. As a result, the transfer of the defect of the mask 2 can be reduced or completely eliminated. FIG. 20(c) shows such a transfer result.

At a position S1 which corresponds to the defect 68a in the transfer region 4A1 of the mask 2, the deformation of the photo resist pattern 10a was not recognized. On the other hand, at a position S2 which corresponds to the defect 68b in the transfer region 4A1 of the mask 2, the deformation (photo resist residue 11) of the photo resist pattern 10a was recognized. However, it was found that such deformation did not reach a level which causes short-circuiting between the patterns. Such a pattern defect, if necessary, can be corrected by a correction processing using energy beams such as FIB (Focused Ion Beams) based on the result of inspection. In this case, since the pattern deformation amount can be suppressed to a relatively small amount, the correction can be performed easily. A dashed line in FIG. 20(c) indicates the light transmitting patterns 2c and the defects 68a, 68b so as to facilitate an understanding of the relative positional relationship between the photo resist patterns 10a and the photo resist residue 11, and the light transmitting patterns 2c and the defects 68a, 68b formed over the photo mask 4A1.

In this manner, according to the multiple exposure processing of the embodiment 1 of the present invention, defects which are present randomly in the transfer region of the mask 2 can be made uniform or eliminated so that the transfer of defects of the mask 2 can be suppressed or prevented. Further, even if the defects are transferred, the transfer limit of the defects can be enlarged. For example, although defects having a dimension equal to or more than 0.2 $\mu$m over the photo mask are transferred in the stepper, in the embodiment 1, only the large defects having a dimension equal to or more than 0.4 $\mu$m over the photo mask 4 are transferred. That is, the defects having a dimension of less than 0.4 $\mu$m over the mask 2 can be ignored so that the dimensional limit of the defect inspection can be alleviated. That is, the defect inspection and the defect correction of the mask 2 can be performed easily. Accordingly, the ease of manufacture of the mask 2 can be enhanced.

Figure 21A:
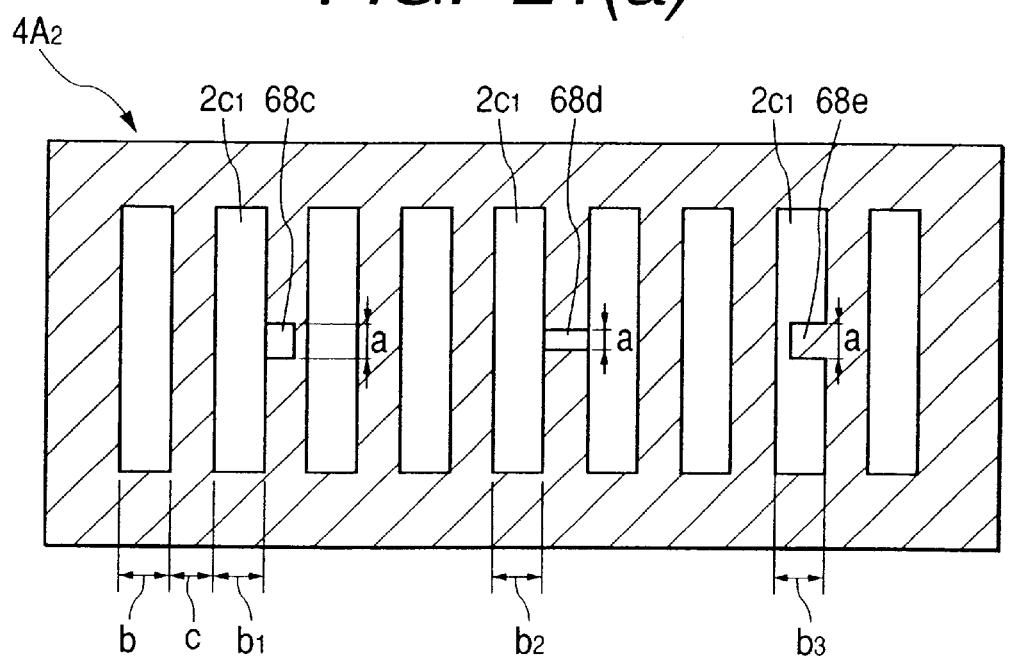
FIG. 21(a) is a plan view of an essential part of a transfer region where defects exist in a mask.
Figure 21B:
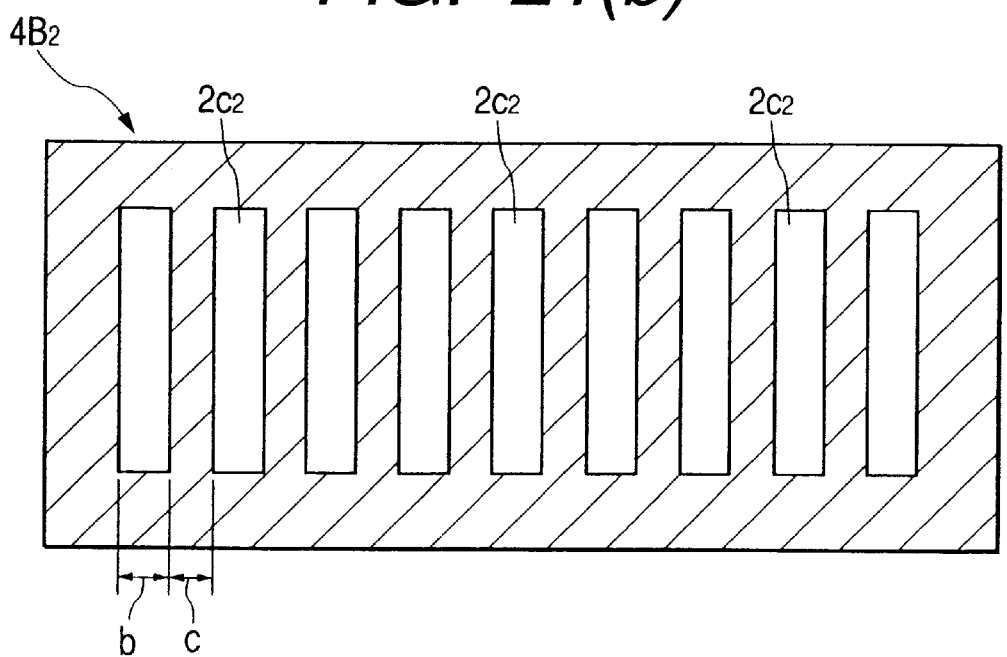
FIG. 21(b) is a plan view of an essential part of a transfer region where no defects exist in a mask.

Further, the inventors of the present invention have investigated the influence which the defects over the mask 2 give to the dimensions of the transfer patterns when the number of multiple exposures is increased in the exposure processing of the embodiment 1 of the present invention. In this case, the exposure conditions are the same as those explained with reference to the above-mentioned exposure apparatus 1. FIGS. 21(a) to 21(b) are plan views showing an essential part of the transfer regions 4A2, 4B2 of the mask 2 used here. FIG. 21(a) is a plan view showing the essential part of the transfer region 4A2 where defects are present. FIG. 21(b) is a plan view showing the essential portion of the transfer region 4B2 where defects are not present. In the transfer regions 4A2, 4B2 shown in FIG. 21(a) and FIG. 21(b), a plurality of light transmitting patterns 2c1, 2c2 having a planar rectangular shape whose respective long sides are arranged in parallel are respectively arranged. The width b of the light transmitting patterns 2c1, 2c2 and the dimension c of the space between neighboring light transmitting patterns 2c1, 2c2 are, for example, around 0.25 $\mu$m. However, in FIG. 21(a), for example, three kinds of defects are shown. That is, FIG. 21(a) shows, for example, a planar square transparent defect 68c having the dimension of one side smaller than the dimension of the above-mentioned space, a planar rectangular transparent defect 68d having the dimension of the long sides equal to the dimension of the above-mentioned space, and a planar square light shielding defect 68e having the dimension of one side made smaller than the dimension of the above-mentioned space. The magnitude of the defect is indicated by a variable a. In the exposure processing, the pattern of FIG. 21(a) having the defects and the pattern of FIG. 21(b) having no defects were exposed by superposition exposure a plural number of times. Then, the dimension of the transfer patterns for the dimensions b1 to b3 of the light transmitting patterns 2c1, 2c2 was evaluated. The result of evaluation is shown in FIGS. 22(a) to 22(c).

Figure 22A:
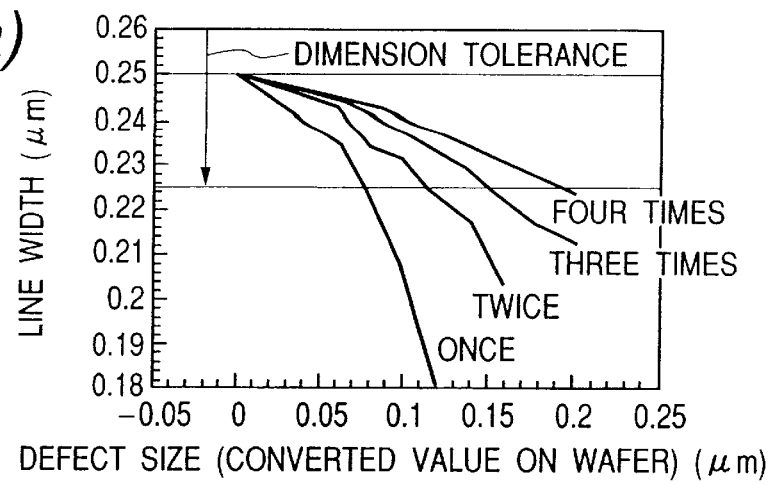
FIG. 22(a) to FIG. 22(c) are graphs showing the result of evaluation of the dimensions of transfer patterns obtained when the exposure is performed using only the mask shown in FIG. 21(a) and when the exposure is performed twice or more using the masks shown in FIG. 21(a) and FIG. 21(b) in the exposure processing by a scanner.
Figure 22B:
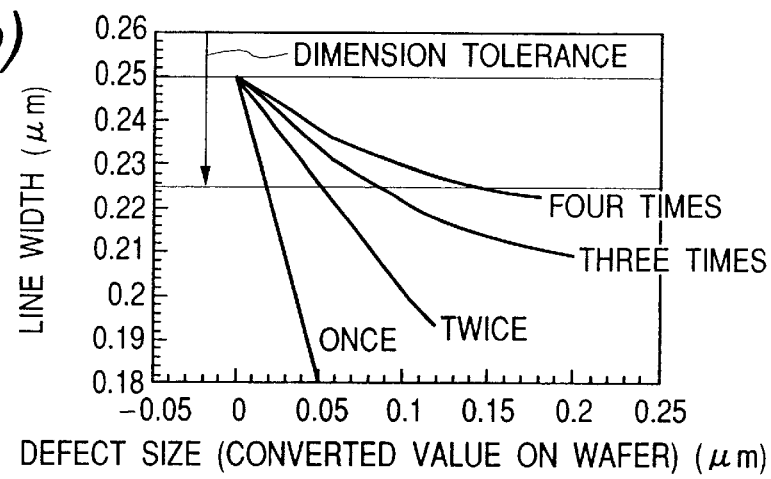
Figure 22C:
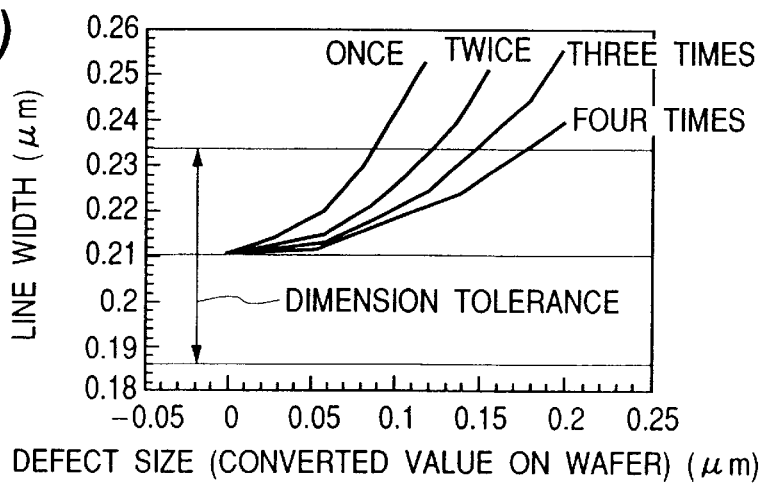

FIG. 22(a) to FIG. 22(c) show the result of measurement for respective dimensions b1 to b3.

In FIG. 22(a) to FIG. 22(c), the term "single" refers to a case in which only the transfer region 4A2 having the defects shown in FIG. 21(a) is exposed; the term "double" refers to a case in which the transfer region 4A2 having defects, as shown in FIG. 21(a), and the transfer region 4B2 having no defects, as shown in FIG. 21(b), are exposed by superposition exposure; the term "triple" refers to a case in which, in addition to the above double exposure, the transfer region 4B2 having no defects, as shown in FIG. 21(b), is further exposed by superposition exposure; and the term "quadruple" refers to a case in which, in addition to the above triple exposure, the transfer region 4B2 having no defects, as shown in FIG. 21(b), is further exposed by superposition exposure. With respect to any one of the defects, it was found that corresponding to the increase of the number of superpositions of the non-defective pattern, the influence of the defects can be reduced. Further, cases in which evaluations are made while focusing on the dimension of the patterns will be explained here. However, as a result of an evaluation conducted on disconnection of patterns, short-circuiting and the like, it was found that if the exposure processing is equal to or more than the triple exposure, irrespective of the magnitude of the defects, the occurrence of disconnection and short-circuiting could be prevented. In this embodiment 1, since a phase shift mask is used, it is preferable that the number of superpositions is set to an even number in view of the generation of the phase inversion.

Figure 23:
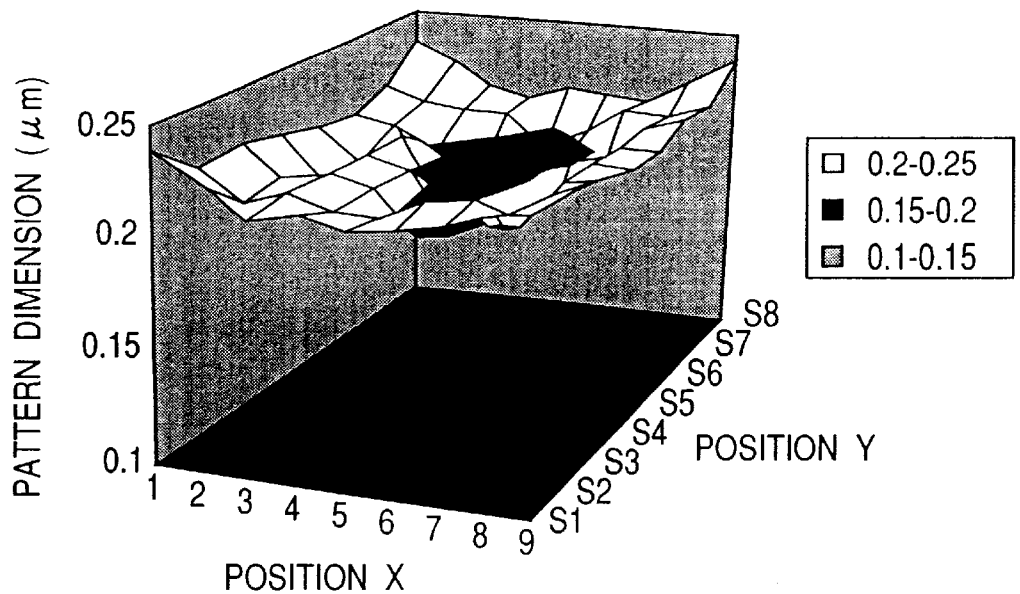
FIG. 23 is a graph showing the accuracy of pattern dimension distribution when a photo mask is exposed once in the exposure processing by a scanner.
Figure 24:
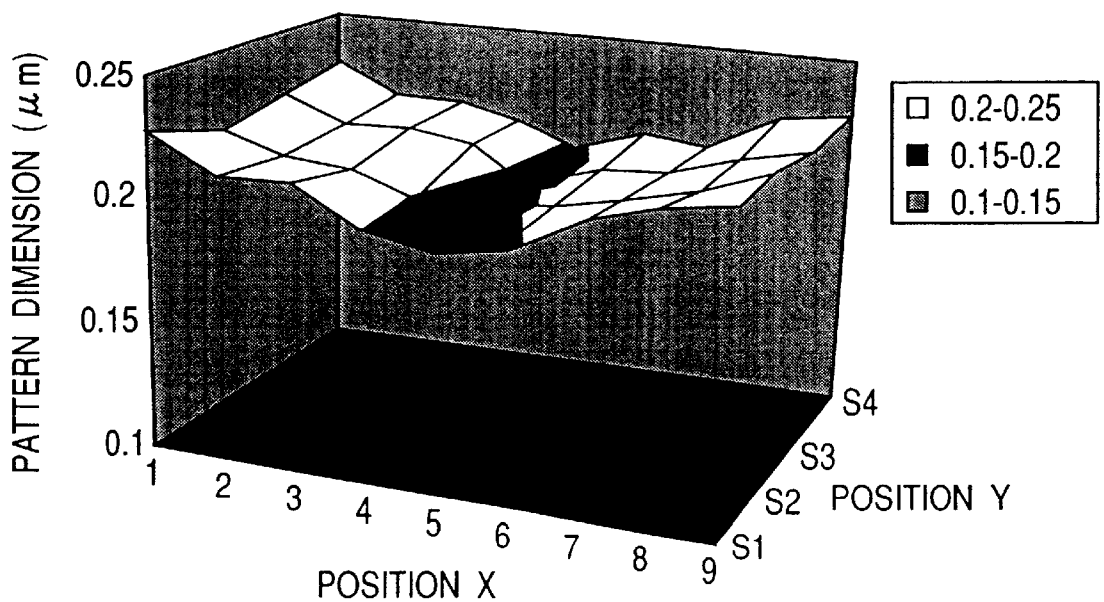
FIG. 24 is a graph showing the accuracy of pattern dimension distribution when a multiple exposure is performed in the exposure processing by a scanner.

Further, according to the multiple exposure method of this embodiment 1, the distribution accuracy of the dimension of patterns transferred to the wafer can be also enhanced. This enhancement of the distribution accuracy will be explained in conjunction with FIG. 23 and FIG. 24. FIG. 23 shows the result when the exposure was performed by a scanner without using the double exposure processing (that is, single exposure). Positions S1 to S4 are taken in one chip and positions S5 to S8 are taken in another chip. In the dimensional distribution of patterns, being influenced by the dimensional distribution of the mask, narrow patterns are formed over central portions of the chips. The difference between the maximum dimension and the minimum dimension was, for example, approximately 0.063 µm. To the contrary, in the multiple exposure method of the embodiment 1 of the present invention, as shown in FIG. 24, since the positions S1 to S4 and the positions S5 to S8 in FIG. 23 are exposed by superposition exposure, the dimensions are made uniform and hence, the accuracy of the dimensional distribution of the transfer patterns can be enhanced. Here, the difference between the maximum dimension and the minimum dimension was, for example, 0.036 µm. That is, the irregularities of the dimension were approximately reduced by half.

In the embodiment 1 in which the above-mentioned multiple exposure processing was performed under the above-mentioned exposure condition, the patterns having the dimension of, for example, 0.25 µm could be favorably formed over the entire surface of the chip with an accuracy of 0.25±0.02 µm. Further, the occurrence of short-circuiting between patterns or the like caused by the defects of the mask 2 could not be recognized.

The manufacturing method for production of the mask 2 according to the embodiment 1 of the present invention will be explained. First of all, prior to the explanation of the method of manufacture of the mask 2 according to the embodiment 1 of the present invention, problems concerning mask manufacture which the inventors of the present invention have reviewed will be explained.

Figure 25A:
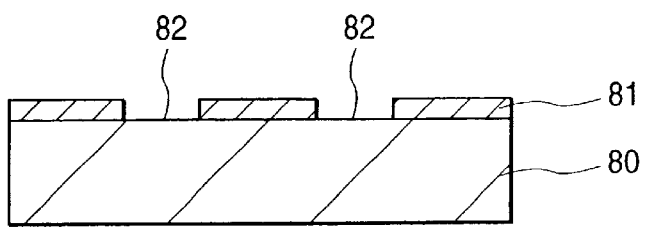
FIG. 25(a) to FIG. 25(e) are partial cross-sectional views of a mask during its manufacturing process which the inventors of the present invention have reviewed.
Figure 25B:
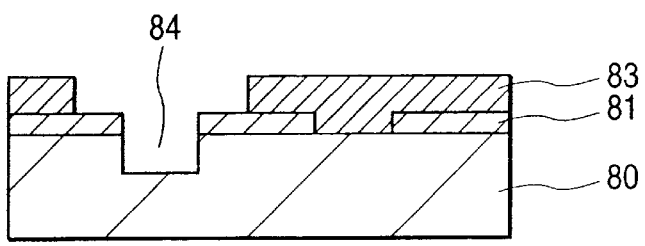
Figure 25C:
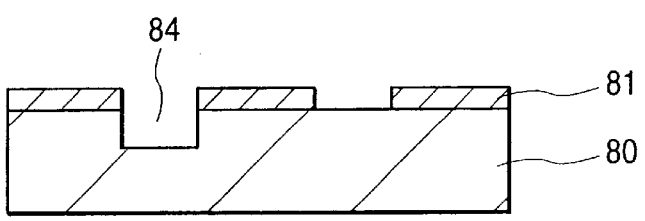
Figure 25D:
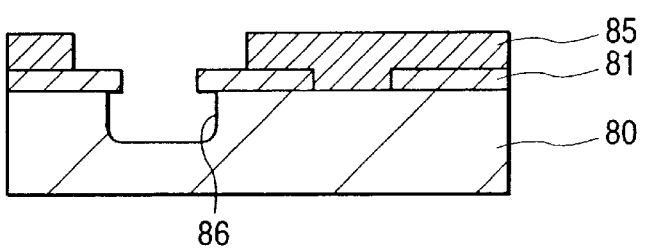
Figure 25E:
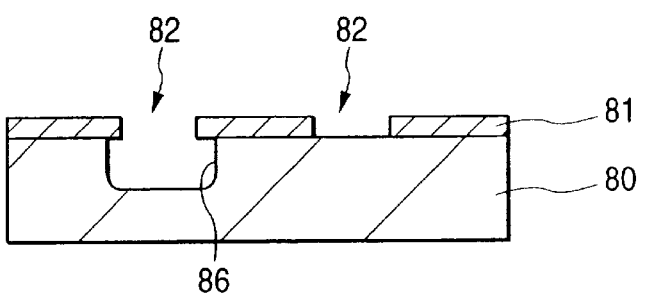

FIGS. 25(a) to 25(e) are a cross-sectional views showing an essential part during the manufacturing process of the mask which the inventors of the present invention have reviewed. In this technique, first of all, as shown in FIG. 25(a), a light shielding pattern 81 and a light transmitting pattern 82 are formed over a mask substrate 80 by a usual method. The light shielding pattern 82 is made of chromium (Cr) or the like. Subsequently, as shown in FIG. 25(b), a resist pattern 83 for forming a shifter is formed over the mask substrate 80 by a usual method. Thereafter, the mask substrate 80 which is exposed through the resist pattern 83 is dug by a dry etching processing so as to form a groove 84 for forming a phase shifter. Here, in the case in which the control of the phase difference at 180 degrees with high accuracy is difficult, the resist pattern 83 is removed as shown in FIG. 25(c), and, thereafter, the phase difference is measured and a next target etching amount is determined. Then, as shown in FIG. 25(d), a resist pattern 85 for forming a shifter is formed over the mask substrate 80 by a usual method and a wet etching processing is performed against the mask substrate 80 with the target etching amount. Here, due to the isotropic etching, such as the wet etching or the like, the mask substrate 80 including portions thereof disposed below the light shielding pattern 81 is etched. In this manner, the groove shifter 86 of the above-mentioned fine eaves type is formed. Finally, by removing the resist pattern 85, as shown in FIG. 25(e), a mask structure having the desired mask patterns and a groove shifter 86 is completed. As mentioned previously, the mask having the groove shifter is requested to have which accuracy in the phase control (that is, depth of the groove). While the depth of the groove shifter depends on the exposure wavelength, along with the increase of demand for the refinement of patterns, the exposure wavelength is becoming short, and, hence, the depth of the groove is also becoming shallow. Accordingly, it appears to be easy to dig the groove. The fact, however, is that the tolerance allowed to form the groove is determined corresponding to the depth of groove and is constant so that the accuracy per se required for the depth of the groove must meet a strict condition. Accordingly, the manufacturing of masks is difficult. Further, to realize the desired phase control with a high accuracy and the formation of eaves type groove shifters, the mask manufacturing process becomes complicated. In view of the above, there arises serious problems such as the increase of the number of mask manufacturing steps or the lowering of the yield.

Figure 26:
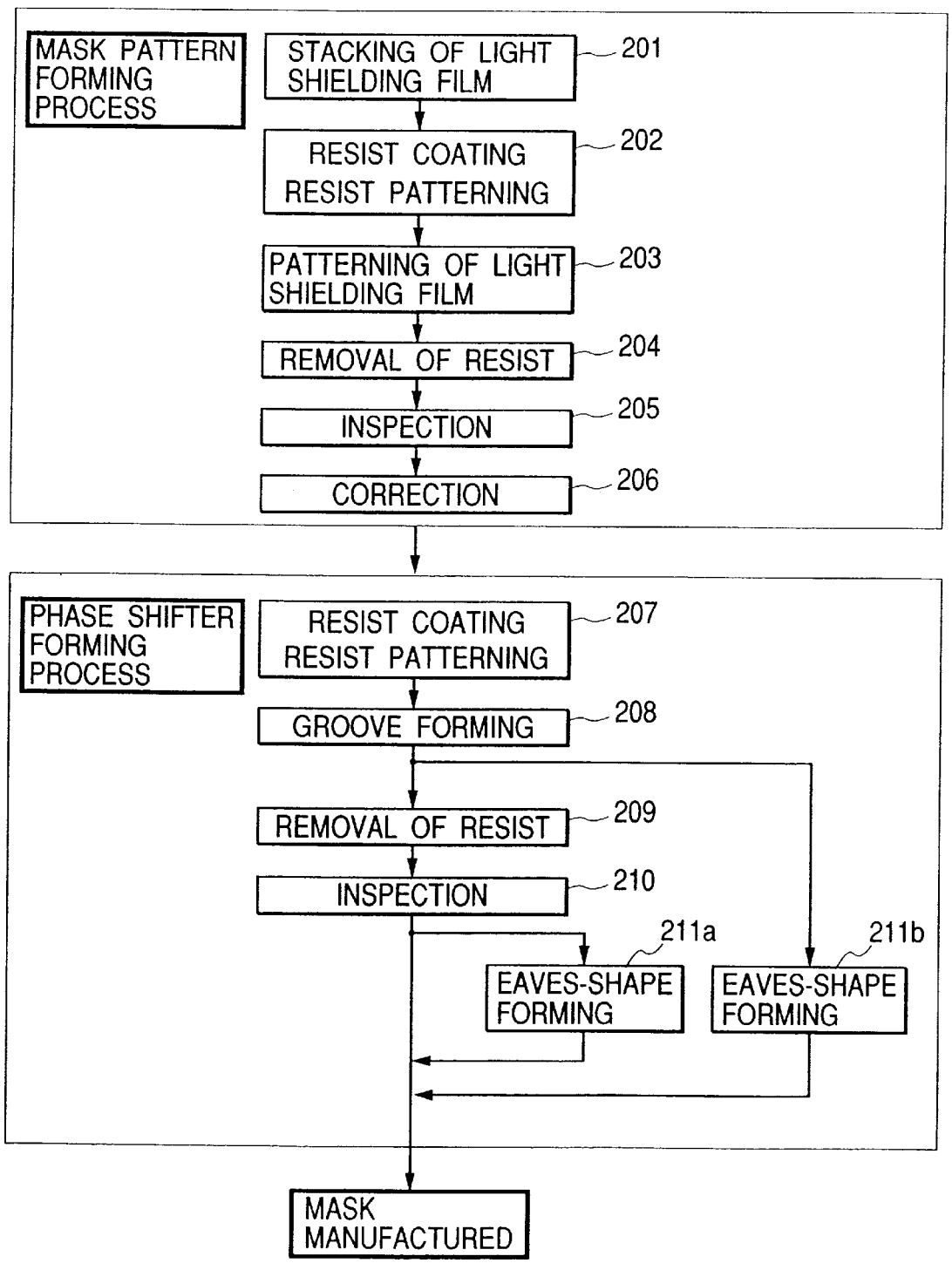
FIG. 26 is a flow chart showing a manufacturing process for production of a mask used in a method of manufacture of semiconductor integrated circuit devices according to one embodiment of the present invention.

An example of a method of manufacture of the mask 2 according to the embodiment 1 of the present invention will be explained with reference to FIGS. 27(a) to 27(c) and FIG. 28, and in accordance with the steps shown in FIG. 26.

Figure 27A:
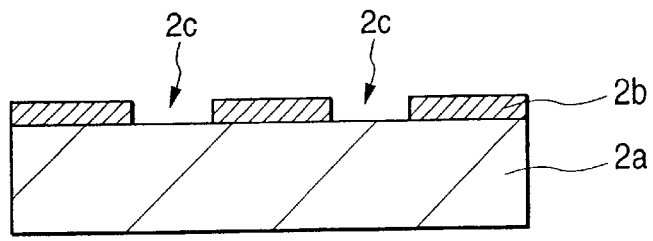
FIG. 27(a) to FIG. 27(c) are cross-sectional views showing an essential part during the mask manufacturing process shown in FIG. 26.

First of all, in the mask pattern forming step, as shown in FIG. 27(a), a light shielding film made of, for example, chromium or the like is stacked on the entire main surface of the mask substrate 2a by a sputtering method or the like (step 201). Subsequently, a photo resist film is coated over the light shielding film and then a given photo resist pattern is formed by patterning the photo resist film (step 202). Thereafter, portions of the light shielding film which are exposed through the photo resist pattern are removed by an etching method or the like so as to form light shielding patterns 2b and light transmitting patterns 2c (step 203). Then, after removing the photo resist pattern (step 204), the presence or non-presence of defects of the patterns and the like is inspected (step 205). Thereafter, based on the result of the inspection, the defects that can be corrected are corrected (step 206). The foregoing steps are the same as those steps of the mask manufacturing technique which the inventors of the present invention have reviewed.

Figure 27B:
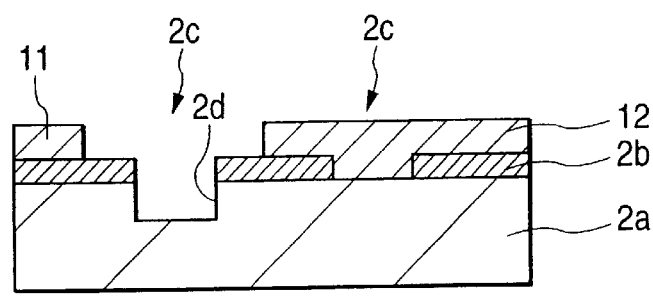
Figure 27C:
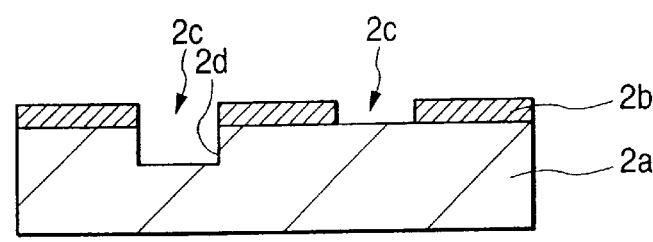

Then, in the phase shifter forming step, over the surface of the light shielding pattern 2b formed over the mask substrate 2a, a photo resist film is coated. Thereafter, by patterning the photo resist film as shown in FIG. 27(b), a photo resist pattern 11 which allows the exposure of a given light transmitting pattern and covers other portions is formed (step 207). Subsequently, using the photo resist pattern 11 as an etching mask, the portions of the mask substrate 2a which are exposed through the photo resist pattern 11 are etched by an anisotropic dry etching method so as to form the groove shifter 2d (step 208), Then, the photo resist pattern 11 is removed as shown in FIG. 27(c) (step 209) and thereafter the phases of the lights which have passed through the mask 2 are inspected (step 210). Thus, the masks 2 are manufactured in this way.

In this embodiment 1 of the present invention, the accuracy of the absolute value control (error tolerance) of the mask phase difference can be alleviated as mentioned above, and, hence, it is unnecessary to perform the measurement of the phase difference or the like in the midst of the process of manufacture of the mask 2 so that it is enough to perform the photo resist pattern forming process only once to form the groove shifter. Further, in the embodiment 1 of the present invention, since the difference of the intensity of light depending on the presence or non-presence of the groove shifter can be cancelled by multiple exposure, it is unnecessary to form eaves to the light shielding pattern. Accordingly, compared to the above-mentioned technique which has been subjected to the review of the inventors of the present invention, this embodiment 1 of the present invention can simplify the manufacturing process for production of the masks 2. That is, the number of manufacturing steps can be reduced so that the manufacturing time can be shortened. Further, the yield of the masks 2 can be enhanced.

Figure 28:
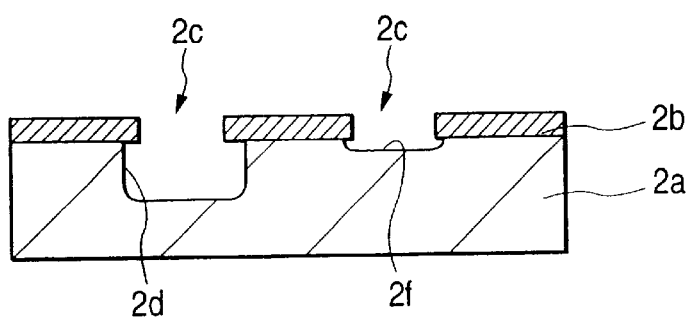
FIG. 28 is a cross-sectional view showing an essential part during the manufacturing process of the mask shown in FIG. 26.

On the other hand, when the difference of the intensity of light provides an adverse influence an the resolution characteristics due to the extreme presence or non-presence of the shifter, as shown in FIG. 28, it is effective to apply an isotropic wet etching to the entire surface of the mask 2 after performing the inspection step 210. That is, by applying the wet etching to both the groove shifter 2d and the portion where the groove shifter 2d is not arranged, an eaves structure can be formed (step 211a). This step is used in the method of manufacture of the mask 2 as previously mentioned with reference to FIG. 7(b). In this case, the difference of the intensity of light due to the presence or non-presence of the groove shifter 2d can be reduced so that the lowering of the resolution characteristics can be prevented.

Further, in the embodiment 1 of the present invention, the absolute value control accuracy of phases can be alleviated in the above-mentioned manner. Accordingly, after the groove forming step 208, an isotropic wet etching processing may be applied to the mask 2 using the photo resist pattern 12 (see FIG. 27(b)) which was used as the mask at the time of processing the groove shifter 2d so as to form the eaves structure (step 211b). This step is used in the method of manufacture of the mask 2 having the structure shown in FIG. 7(c). From a structural point of view, although this structure becomes equal to the structure shown in FIG. 25(e), which the inventors have reviewed, in this embodiment 1 of the present invention, since it is sufficient to perform the coating of the photo resist film and the patterning step respectively only once, the manufacturing steps for production of the mask 2 can be simplified compared to the above-mentioned reviewed technique.

Figure 29:
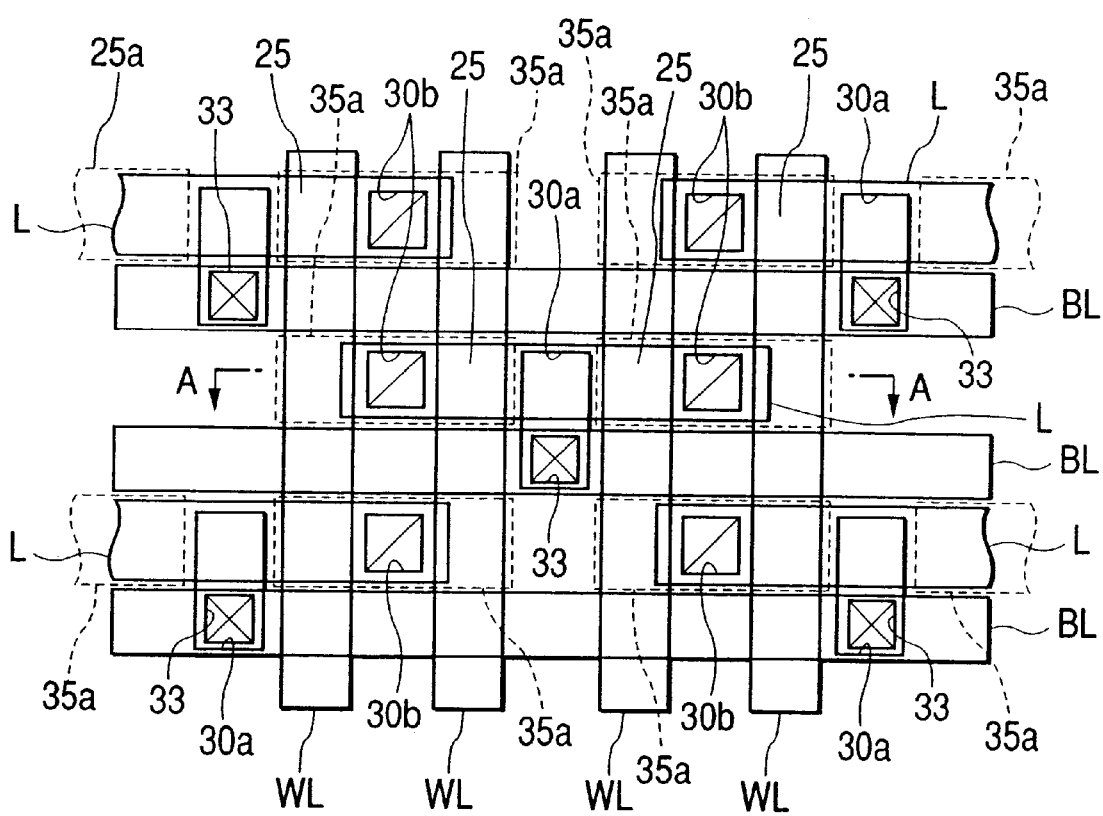
FIG. 29 is a plan view of a semiconductor integrated circuit device which is manufactured by adopting an exposure method in the manufacture of semiconductor integrated circuit devices according to one embodiment of the present invention.
Figure 30:
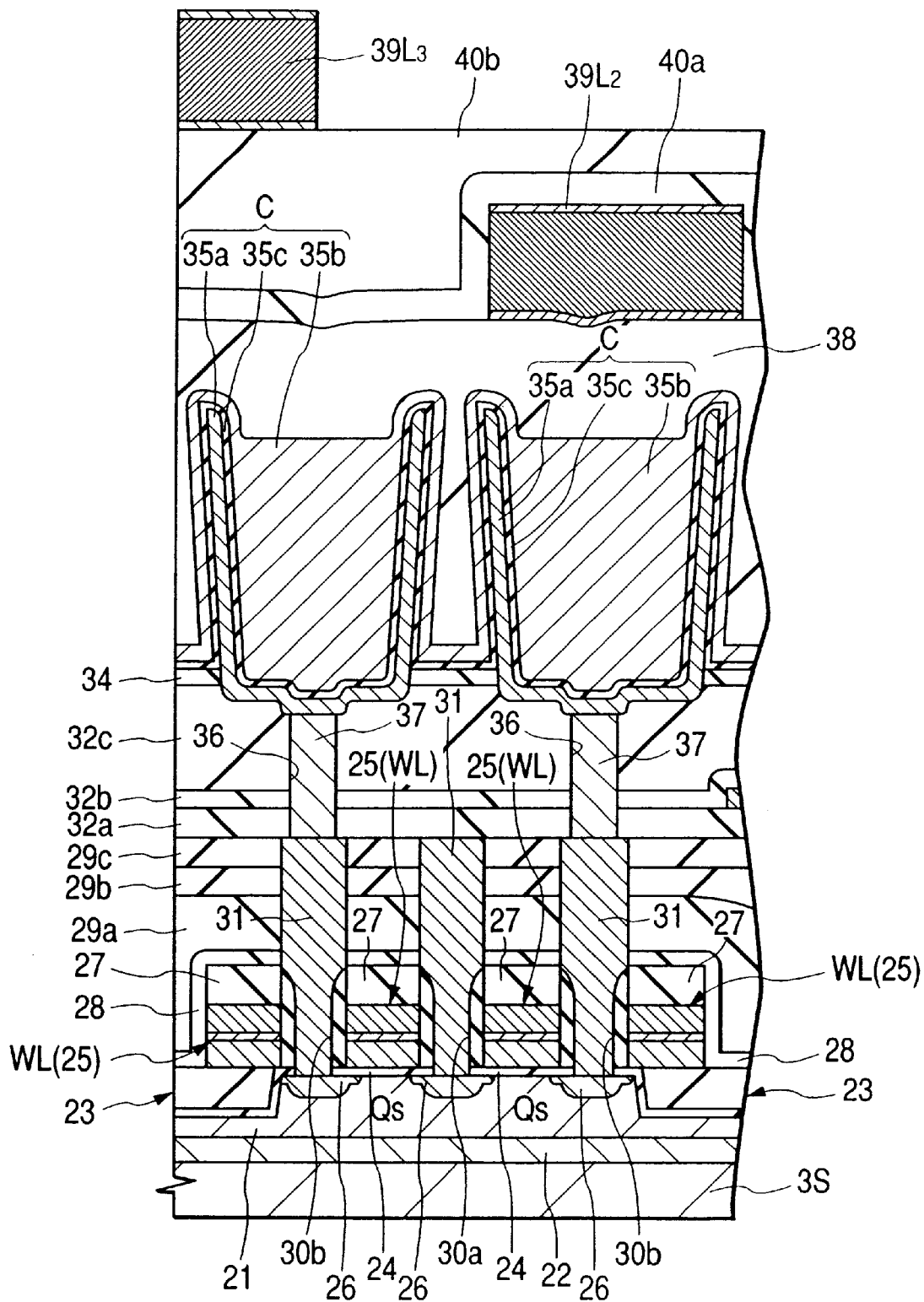
FIG. 30 is a cross-sectional view taken along a line A—A of FIG. 29.

One example in which the technical concept of the present invention is applied to a case where respective patterns of a DRAM (Dynamic Random Access Memory) are transferred by an exposure processing is shown in FIG. 29 and FIG. 30. FIG. 30 is a cross-sectional view taken along a line A—A of FIG. 29. By applying the exposure method of this embodiment to the method of manufacture of a DRAM, particularly, the number of defects in the chips can be reduced, so that the number of bit relief chips can be reduced.

The semiconductor substrate 3S represents a portion which constitutes a chip having a planar quadrangular shape of a DRAM cut out from the above-mentioned wafer 3 having a planar approximately circular shape, for example. The semiconductor substrate 3S is made of p-type single-crystal silicon, for example. A p-type well 21 is formed over a main surface of the semiconductor substrate 3S and a memory cell of the DRAM is formed over the p-type well 21. The p-type well 21 at a region where the memory cell is formed is electrically separated from the semiconductor substrate 3S by means of an n-type semiconductor region 22 formed below the p-type well 21 so as to prevent the intrusion of noise from an input and output circuit formed in the other region of the semiconductor substrate 3S.

The memory cell is constituted by a stacked structure which arranges information storing capacity elements C on upper portions of memory cell selection MISFET Qs. The memory cell selection MISFET Qs are composed of n channel type MISFET and are formed over active regions L of the p-type well 21. The active regions L are constituted by patterns having an elongated island shape which extend in the direction X in FIG. 29. Two memory cell selection MISFET Qs which share either one (n-type semiconductor region) of a source or a drain in common and are arranged close to each other in the direction X are formed over each active region L.

An element separation region which surrounds each active region L is constituted by a trench-type element separation portion (trench isolation) 23 which is formed by embedding an insulation film made of a silicon oxide film or the like into a shallow groove formed in the p-type well 21. The insulation film which is embedded in the trench-type element separation portion 23 has a surface thereof flattened such that the surface has the same level as that of the surface of the active region L. The element separation region, which is constituted by an element separation portion 23, is set free from the forming of the bird's beak at an end portion of the active region L. Accordingly, the element separation region can increase the effective area of the active region L compared to an element separation region (field oxide film) having the same dimension formed by LOCOS (Local Oxidization of Silicon: selective oxidization) method.

The memory cell selection MISFET Qs is mainly comprised of a gate insulation film 24, a gate electrode 25 and a pair of n-type semiconductor regions 26, 26 which constitute a source and a drain. The gate electrode 25 is integrally constituted with a word line WL, which extends linearly along the direction Y while having the same width and the same space. The gate electrode 25 (word line WL) has a polymetal structure which is comprised of, for example, a low resistance polycrystalline silicon film doped with n-type impurities such as P(phosphor), a barrier metal layer made of a WN (tungsten nitride) film and formed over the silicon film and a high melting point metal film such as a W(tungsten) film formed over the barrier metal layer. The gate electrode 25 (word line WL) having a polymetal structure has a low electrical resistance compared to the gate electrode constituted by a polycrystalline silicon film or a polycide film, and, hence, the signal delay of the word line can be reduced. However, the gate electrode 25 may be formed of a single substance film made of polycrystalline silicon or it may have the above-mentioned polycide structure which is formed by stacking a silicide film made of tungsten silicide or the like over the polycrystalline silicon film.

Cap insulation films 27 in the form of nitride silicon films or the like are formed over upper portions of gate electrodes 25 (word lines L) of the memory cell selection MISFET Qs. On upper portions and side walls of the cap insulation films 27 and on side walls of the gate electrodes 25 (word lines WL), for example, an insulation film 28 made of a nitride silicon is formed. The cap insulation films 27 and the insulation film 28 of the memory array are used as etching stoppers at the time of forming contact holes on upper portions of the sources and drains (n-type semiconductor regions 26, 26) of the memory cell selection MISFET Qs by a self-alignment process.

Over the memory cell selection MISFET Qs, an SOG (Spin On Glass) film 29a is formed. Further, over the SOG film 29a, insulation films 29b, 29c made of two-layered silicon oxide or the like are formed. Further, the insulation 29c which constitutes an upper layer has a surface thereof flattened such that the surface has the same level over the entire region.

Over a pair of n-type semiconductor regions 26, 26 which constitute a source and a drain of the memory cell selection MISFET Qs, contact holes 30a, 30b which penetrate the insulation films 29c, 29b and the SOG film 29a are formed. In the inside of these contact holes 30a, 30b, the plugs 31 which are constituted by low-resistance polycrystalline silicon films doped with n-type impurities (for example, P(phosphor)) are embedded.

The diameter in the X direction of bottom portions of the contact holes 30a, 30b is defined by a space formed between the insulation film 28 of a side wall of one of two opposing gate electrodes 2S and the insulation film 28 of a side wall of the other gate electrode 25. That is, the contact holes 30a, 30b are formed against the gate electrodes 25 (word lines WL) by a self alignment process.

As shown in FIG. 29, out of a pair of contact holes 30a, 30b, the diameter of one contact hole 30b in the Y direction (up-and-down direction in FIG. 29) is approximately equal to the dimension of the active region L in the Y direction. To the contrary, the diameter of the other contact hole 30a (the contact hole over the n-type semiconductor region 26 shared in common by two memory cell selection MISFET Qs) in the Y direction is larger than the dimension of the active region L in the Y direction. That is, the contact hole 30a is constituted by a planar pattern having an approximately rectangular shape whose diameter in the Y direction is larger than the diameter in the X direction (left-and-right direction in FIG. 29). A portion of the contact hole 30a protrudes out from the active region L and extends over the groove-type element separation portion 23 on a plane.

By constituting the contact hole 30a with such a pattern, at the time of electrically connecting a bit line BL with the n-type semiconductor region 26 through the contact hole 30a, it is unnecessary to widen a portion of the width of the bit line BL and to extend the bit line BL to an upper portion of the active region L or to extend a portion of the active region L in the direction of the bit line BL, and, hence, the size of the memory cell can be reduced.

An insulation film 32a is formed over the insulation film 29c. Through holes 33 are formed in the insulation film 32a over the contact holes 30a. In the inside of the through holes 33, plugs made of conductive films which are formed by laminating a Ti (titanium) film, a TiN (titanium nitride) film and a W(tungsten) film in order from the lower layer are embedded. The through holes 33 are arranged above the element trench-type separation portions 23 which are disposed away from the active regions L.

Over the insulation films 29c, the bit lines BL are formed. The bit lines BL are arranged above the groove-type element separation part 23. The bit lines BL are linearly extended in the X direction with the same width and the same space. The bit lines BL are made of tungsten films, for example. The bit lines BL are electrically connected with either one (the n-type semiconductor region 26 shared in common by two memory cell selection MISFET Qs) of the source or the drain of the memory cell selection MISFET Qs through the above-mentioned through holes 33 and contact holes 30a formed in the insulation films 32a, 29c, 29b, the SOG film 29a and the gate insulation film 24 which are disposed below the through hole 33. By forming the bit lines BL using a metal (tungsten), the sheet resistance can be reduced, and, hence, the reading and writing of information can be performed at a high speed. Further, since the bit lines BL and the wiring of the peripheral circuit can be formed simultaneously by the same steps, the steps for manufacture of the DRAM can be simplified. Still further, by constituting the bit lines BL of a metal (tungsten) having a high heat resistance and a high resistance against electromigration, even when the width of the bit lines BL is made fine or minute, the problem of disconnection can be surely prevented.

Over the bit lines BL, for example, insulation films 32b, 32c made of silicon oxide are formed. The insulation film 32c which constitutes an upper layer has a surface thereof flattened over the entire region of the semiconductor substrate 3S. Over the insulation film 32c of the memory cell array, an insulation film 34 made of silicon nitride or the like is formed. Over this insulation film 34, information storing capacity elements C are formed. Each information storing capacity element C includes a lower electrode (a storage electrode) 35a, an upper electrode (a plate electrode) 35b, and a capacity insulation film (a dielectric film) 35c made of $Ta_2O_5$ (tantalum oxide) which is interposed between them. The lower electrode 35a is, for example, made of a low resistant polycrystalline silicon film doped with phosphor (P) and the upper electrode 35b is, for example, made of a TiN film. The lower electrodes 35a of the information storing capacity elements C are electrically connected with the plugs 31 in the contact holes 30b by way of the plugs 37 which are embedded in the inside of the through holes 36 that penetrate the insulation film 34 and the insulation films 32c, 32b, 32a disposed below the insulation film 34 and further are electrically connected with the other (the n-type semiconductor region 26) of the sources or the drains of the memory cell selection MISFET Qs by way of the plugs 31.

Over the information storing capacity element C, an insulation film 38 made of two-layered oxide silicon or the like is formed. Further, over the insulation film 38, a wiring 39L2 which constitutes a second layer is formed. Over the wiring 39L2 constituting the second layer, insulation films 40a, 40b respectively made of two-layered silicon oxide or the like are formed. Out of these two films, the insulation film 40a which constitutes the lower layer is formed by the High Density Plasma CVD method which has excellent gap fill characteristics with respect to the wiring 39L2. Further, the insulation film 40b arranged above the insulation film 40a has a surface thereof flattened such that the surface has approximately the same level over the entire region of the semiconductor substrate 3S. Over the insulation film 40b, a wiring 39L3 which constitutes the third layer is formed. The wiring 39L2, 39L3 which constitute the second and third layers are, for example, constituted by conductive films mainly made of Al (aluminum) alloy, for example.

As has been described heretofore, according to the embodiment 1 of the present invention, the following advantageous effects can be obtained.

(1) By exposing the patterns over the mask 2 which are identical with each other, but have the phases of lights which pass therethrough inverted by 180 degrees from each other onto the same region of the wafer 3 by superposition exposure, the tolerance of the phase difference (accuracy of absolute value control of the phase difference) of the mask 2 having the groove shifters 2d can be alleviated.

(2) By exposing the identical patterns over the mask 2 onto the same region of the wafer 3 by superposition exposure, the limit dimension of the defect inspection for the mask 2 having the groove shifters 2d can be alleviated.

(3) By exposing the patterns over the mask 2 which are identical with each other, but have the phases of lights which pass therethrough inverted by 180 degrees from each other onto the same region of the wafer 3 by superposition exposure, the fluctuation of the dimensions of neighboring transfer patterns due to the presence or non-presence of the arrangement of the groove shifters 2d can be suppressed or prevented.

(4) Due to the above-mentioned advantageous effect (3), it is unnecessary for the groove shifter 2d of the mask 2 to have an eaves structure.

(5) Due to the above-mentioned advantageous effects (1),(2) or (4), the ease of manufacture of the masks 2 can be enhanced.

(6) Due to the above-mentioned advantageous effects (1),(2),(3),(4) or (5), the yield in the manufacture of the mask 2 can be enhanced.

(7) By exposing the identical patterns over the mask 2 onto the same region of the wafer 3 by superposition exposure, the dimensional distribution of the mask patterns in the mask 2 can be made uniform so that the fluctuation of the dimension of transfer patterns due to the difference of dimensions of the mask patterns can be suppressed or prevented.

(8) In performing the scanning exposure, by exposing the identical patterns over the mask 2 along the scanning direction by superposition exposure, the lens aberration of the optical system of the exposure apparatus 1 can be made uniform.

(9) Due to the above-mentioned advantageous effects (8) or the like, the dimensional accuracy of the transfer patterns can be enhanced.

(10) Due to the above-mentioned advantageous effects (1),(7), (8),(9) or the like, the yield of the semiconductor integrated circuit devices can be enhanced.

(11) Due to the above-mentioned advantageous effects (1),(7), (8),(9) or the like, the reliability of the semiconductor integrated circuit devices can be enhanced.

(12) Due to the above-mentioned advantageous effects (1),(7), (8),(9) or the like, the performance of the semiconductor integrated circuit devices can be enhanced.

(13) Due to the above-mentioned advantageous effects (1),(7), (8),(9) or the like, the integration of elements and wiring of the semiconductor integrated circuit devices can be enhanced.

Embodiment 2

According to the result of the investigation carried out by the inventors of the present invention, in a phase shift mask which arranges auxiliary mask patterns around light transmitting patterns which constitutes main patterns, it was newly found that the resolution dimensions of patterns to be transferred are different depending on the manner of arranging groove shifters, to be more specific, between a case in which the groove shifters are arranged in the light transmitting patterns which constitutes the main patterns and a case in which the groove shifters are arranged in the auxiliary patterns. As mentioned previously, the auxiliary mask patterns are opening patterns provided for enhancing the resolution characteristics of the light transmitting patterns which constitute the main patterns and are light transmitting patterns which are opened to the mask such that the patterns do not form independent images on a wafer when the patterns are projected onto the wafer.

The essential part of such a phase shift mask is shown in FIGS. 31(a) and 31(b) and FIG. 32(a) and 32(b).

Figure 31A:
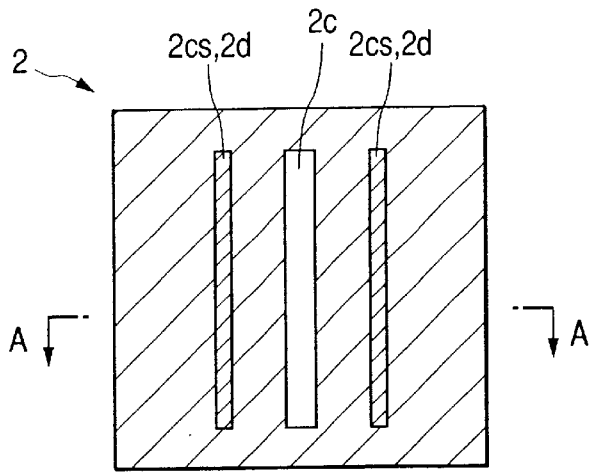
FIG. 31(a) is a plan view of an essential part of a mask used in a method of manufacture of semiconductor integrated circuit devices according to another embodiment of the present invention.
Figure 31B:
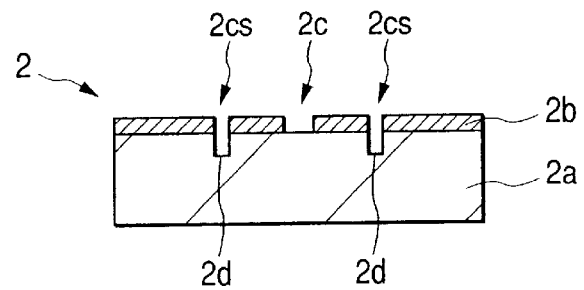
FIG. 31(b) is a cross-sectional view taken along a line A—A of FIG. 31(a).

FIG. 31(a) is a plan view showing the essential part of the mask 2 and FIG. 31(b) is a cross-sectional view taken along a line A—A of FIG. 31(a). A light transmitting pattern 2c formed in a planar strip shape is made by forming openings in a light shielding film on a mask substrate 2a. The light transmitting pattern 2c constitutes a main pattern which is to be transferred over the wafer by the exposure processing. In the vicinity of both long sides of the light transmitting pattern 2c, auxiliary mask patterns 2cs having a planar strip shape are arranged parallel to the light transmitting pattern 2c with light shielding patterns 2b having a given planar length disposed between them. The auxiliary mask patterns 2cs are provided for enhancing the resolution characteristics of the light transmitting patterns 2c and are formed by forming openings in the light shielding film over the mask substrate 2a. The length of the auxiliary mask patterns 2cs in the longitudinal direction is equal to the length of the light transmitting patterns 2c in the longitudinal direction. However, to prevent the auxiliary mask patterns 2cs from being transferred onto the wafer, the width of the auxiliary mask patterns 2cs is designed to be narrower than the width of the light transmitting patterns 2c. In FIG. 31, to make the light which has passed through the light transmitting patterns 2c and the light which has passed through the auxiliary mask patterns 2cs have their phases inverted at 180 degrees from each other, groove shifters 2d are arranged in the auxiliary mask patterns 2cs.

Figure 32A:
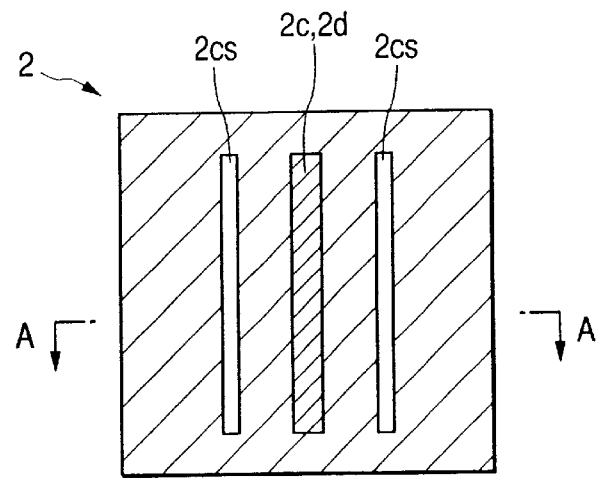
FIG. 32(a) is a plan view of an essential part at another planar position in the mask shown in FIG. 31(a).
Figure 32B:
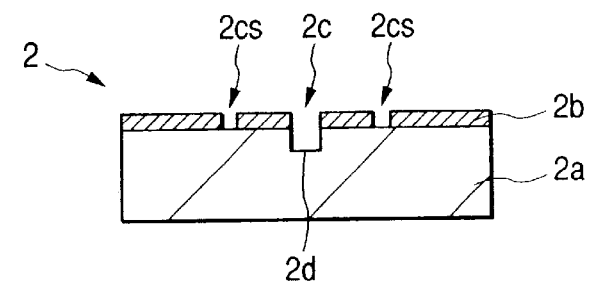
FIG. 32(b) is a cross-sectional view taken along a line A—A of FIG. 32(a).

On the other hand, FIG. 32(a) is a plan view showing an essential part of the mask 2 shown in FIG. 31(a) at different planar positions over the same plane. FIG. 32(b) is a cross-sectional view taken along a line A—A of FIG. 32(a) The shapes and the dimensions of the light transmitting pattern 2c and the auxiliary mask patterns 2cs are as same as those of FIG. 31(a). However, in FIG. 32(a), the groove shifter 2d is arranged in the light transmitting pattern 2c such that the lights which have passed through the light transmitting pattern 2c and the light which have passed through the auxiliary mask patterns 2cs have their phases inverted at 180 degree from each other. That is, with respect to FIG. 31(a) and FIG. 32(a), when the phases of the transmitting lights over the same planar position are compared, the phases of respective lights are inverted at 180 degrees from each other.

According to the result of the investigation carried out by the inventors of the present invention, it was newly found that when single exposure processing is performed using the mask 2, the dimensions of the transferred patterns are different between FIG. 31(a) and FIG. 32(a). Accordingly, in this embodiment 2, as in the case of the embodiment 1, by exposing the mask pattern of FIG. 31(a) and the mask pattern of FIG. 32(a) onto the same region of the wafer by superposition exposure (multiple exposure), the dimensional accuracy of the patterns transferred to the wafer can be remarkably enhanced for the same reasons as explained with reference to the above-mentioned embodiment 1.

Embodiment 3

In this embodiment 3, an example in which the present invention will be applied to hole pattern is explained. Here, the hole patterns refer to holes such as contact holes, through holes and the like which are formed in insulation films for electrically connecting different layers.

Figure 33A:
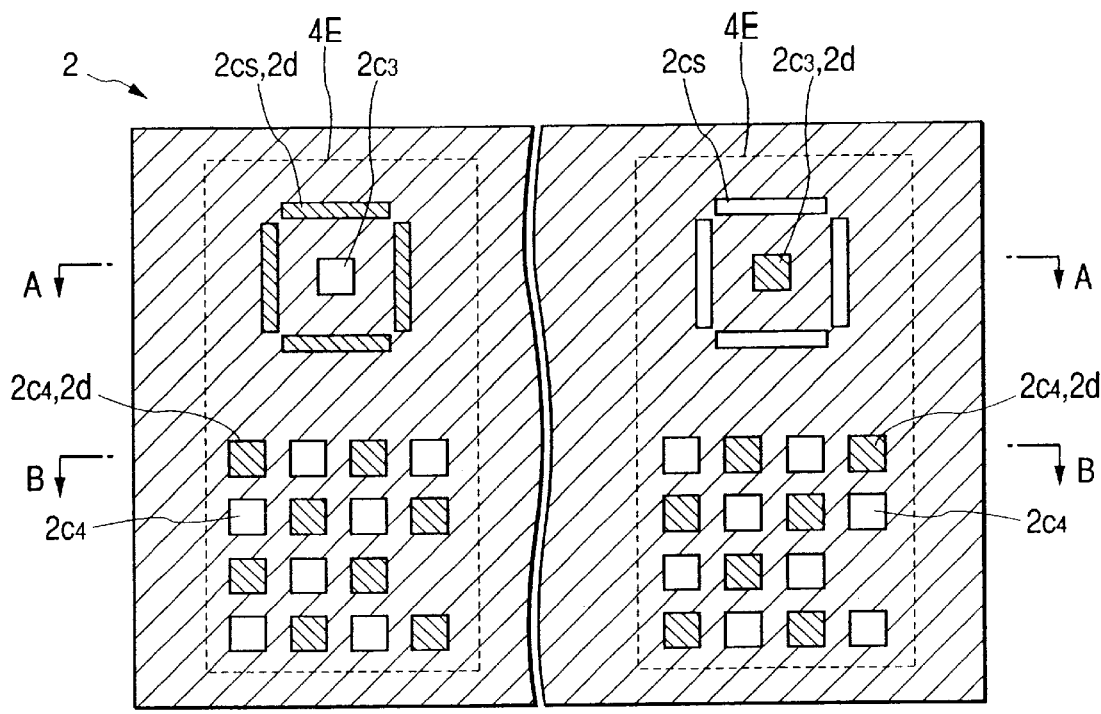
FIG. 33(a) is a plan view of an essential part of a mask used in a method of manufacture of semiconductor integrated circuit devices according to still another embodiment of the present invention.
Figure 33B:
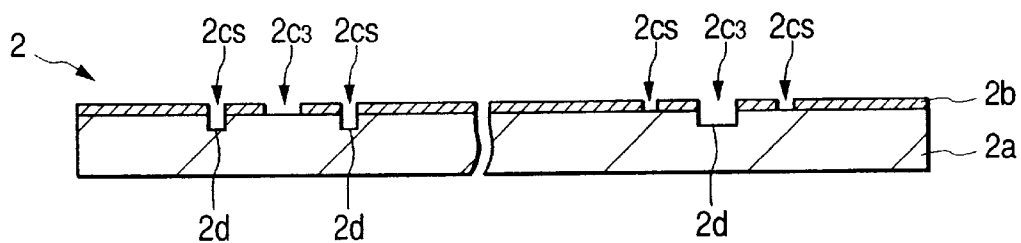
FIG. 33(b) and FIG. 33(c) are cross-sectional views taken along a line A—A and a line B—B of FIG. 33(a), respectively.
Figure 33C:
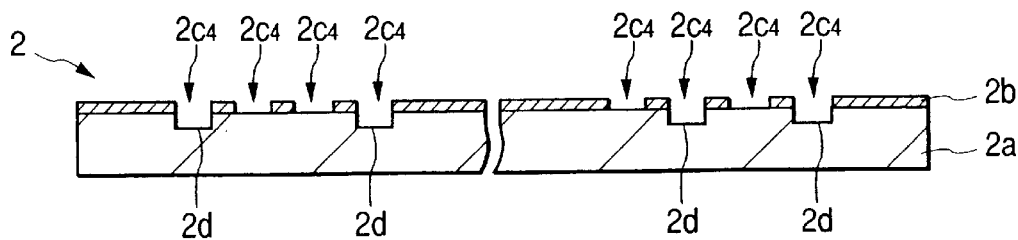

FIG. 33(a) is a plan view showing an essential part of a mask 2. FIG. 33(b) and FIG. 33(c) are cross-sectional views taken along a line A—A and a line B—B of FIG. 33(a). In this mask 2, two transfer regions 4E1 4F which are superposed at the time of performing the exposure processing are provided. The transfer regions 4E, 4F are arranged at different planar positions over the same plane of the same mask 2. In each transfer region 4E. 4F, for example, a light transmitting pattern 2c3 having a planar square shape, auxiliary mask patterns 2cs which surround four peripheral sides of the light transmitting pattern 2c3 and a plurality of light transmitting patterns 2c4 having a planar square shape are arranged.

The light transmitting patterns 2c3 are patterns which are provided for transferring an isolated hole pattern and are made by forming openings in a light shielding film over, a mask substrate 2a. The auxiliary patterns 2cs are patterns which are provided for enhancing the resolution of the light transmitting patterns 2c3 and are formed with a pattern width which is equal to or less than the resolution limit. With respect to the light transmitting patterns 2c3 and the auxiliary mask patterns 2cs, groove shifters 2d are arranged in either one of the light transmitting pattern 2c3 or the auxiliary mask patterns 2cs such that the lights which pass through the light transmitting pattern 2c3 and the auxiliary mask patterns 2cs have their phases inverted by 180 degrees relative to each other. In this case, in the transfer region 4E, the groove shifters 2d are arranged at the auxiliary mask patterns 2cs, and in the transfer region 4F, the groove shifter 2d is arranged at the light transmitting pattern 2c3. That is, in the regions where the light transmitting patterns 2c3 and the auxiliary mask patterns 2cs are formed, in the transfer region 4E and the transfer region 4F, when the phases of the transmitting lights over the same planar position are compared, the phases of respective light are inverted by 180 degrees relative each other.

Further, the light transmitting patterns 2c4 are patterns which are provided for transferring repeatedly and densely arranged hole patterns. A plurality of light transmitting patterns 2c4 are regularly arranged at a given interval in the up-and-down direction as well as left-and-right direction in FIG. 33(a). In a plurality of these light transmitting patterns 2c4, the groove shifters 2d are arranged such that the lights which have passed through respective light transmitting patterns 2c4 which are disposed close to each other have their phases inverted by 180 degrees relative to each other. In this case, with respect to a group comprised of a plurality of light transmitting patterns 2c4, in the transfer region 4E and the transfer region 4F, when the phases of the transmitting lights over the same planar position are compared, the phases of respective light are inverted by 180 degrees relative to each other.

By exposing these transfer regions 4E, 4F onto the same region over the wafer by superposition exposure (multiple exposure), the fine hole patterns can be favorably transferred onto the wafer with the high dimensional accuracy for the same reasons as explained with reference to the above-mentioned embodiment 1.

Although the various aspects of the invention made by the inventors have been specifically explained based on embodiments 1 to 3, it is needless to say that the present invention is not limited to the above-mentioned embodiments 1 to 3 and that various modifications can be made within the scope of the appended claims without departing from the gist of the present invention.

For example, although the case has been considered in which identical mask patterns at different planar positions over the same plane of the same mask are exposed by superposition exposure in the above-mentioned embodiments 1 to 3, the present invention is not limited to this technique. For example, identical mask patterns which are formed over physically separate individual masks may be exposed by superposition exposure.

Further, the exposure conditions are not limited to those explained in connection with the above-mentioned embodiments 1 to 3, and they can be variously changed. For example, as the exposure light, i lines having an exposure wavelength of 365 nm may be used. As the lighting, a deformation lighting such as an oblique lighting or a bracelet-lighting may be used.

In the above-mentioned description of the present invention, although the case has been considered in which the present invention is applied to a DRAM which is the field of the invention constituting the background of the present invention made by the inventors, the present invention is not limited to a DRAM, but is applicable, for example, to semiconductor integrated circuit devices having memory circuits, such as a SRAM (Static Random Access Memory) or flash memories (EEPROM: Electric Erasable Programmable Read Only Memory), semiconductor integrated circuit devices having logic circuits, such as microprocessors or the like, or hybrid-type semiconductor integrated circuit devices mounting the above-mentioned memory circuits and logic circuits on the same semiconductor substrate. Particularly, the present invention is advantageous technique when applied to a lithography technique which uses a phase shift mask constituting an updated product having a minimum processing dimension of equal to or less than 0.15 µm.

To briefly explain or recapitulate the advantageous effects obtained by typical features the invention disclosed in the specification and drawings, they are summarized as follows.

(1) According to the present invention, by exposing patterns over the mask which are identical with each other, but have the phases of lights which pass therethrough inverted from each other, onto the same region of the wafer by superposition exposure, the accuracy of absolute value control of the phase of the mask having the groove shifters can be alleviated.

(2) According to the present invention, by exposing patterns over the mask which are identical with each other, but have the phases of lights which pass therethrough inverted from each other, onto the same region of the wafer by superposition exposure, the dimensional accuracy of patterns which are transferred by using a mask having a groove shifter can be enhanced.

(3) According to the present invention, by exposing identical patterns over the mask onto the same region of the wafer by superposition exposure, the defect detection dimension in the testing of a mask having groove shifters can be alleviated.

(4) According to the present invention, due to the above-mentioned advantageous effects (1) or (3), the ease of manufacture of the masks having a groove shifter structure can be enhanced.

(5) According to the present invention, due to the above-mentioned advantageous effects (1),(2) or (3), the yield in the manufacture of masks having a groove shifter structure can be enhanced.

(6) According to the present invention, due to the above-mentioned advantageous effects (1),(2) or (3), the yield of the; semiconductor integrated circuit devices can be enhanced.

(7) According to the present invention, due to the above-mentioned advantageous effects (1),(2) or (3), the reliability of the semiconductor integrated circuit devices can be enhanced.

(8) According to the present invention, due to the above-mentioned advantageous effects (1),(2) or (3), the performance of the semiconductor integrated circuit devices can be enhanced.

(9) According to the present invention, due to the above-mentioned advantageous effects (1),(2) or (3), the integration of elements and wiring of the semiconductor integrated circuit devices can be enhanced.

What is claimed is:

1. A method of manufacturing semiconductor integrated circuit devices comprising the steps of:
   (a) forming a photoresist film on a main surface of a wafer,
   (b) mounting the wafer provided with the photoresist film on a wafer stage of an exposure apparatus,
   (c) exposing a first phase shift mask pattern including a substrate groove shifter on a first region of the main surface of the wafer mounted on the wafer stage by reduction projection exposure using ultraviolet light, the first phase shift mask pattern having phase errors or random defects, and
   (d) after the step (c), exposing a second phase shift mask pattern formed over the same main surface of the same mask substrate as the first phase shift mask pattern, on the first region of the main surface of the wafer mounted on the wafer stage by reduction projection exposure using ultraviolet light, the second phase shift mask including a substrate groove shifter, and having phase errors or random defects, and a phase thereof inverted from a phase of the first phase shift mask pattern.

2. A method of manufacturing semiconductor integrated circuit devices according to claim 1, wherein the exposing in the steps (c) and (d) is performed by scanning exposure.

3. A method of manufacturing semiconductor integrated circuit devices according to claim 2, wherein the first and second phase shift mask patterns are on a Levenson-type phase shift mask.

4. A method of manufacturing semiconductor integrated circuit devices according to claim 3, wherein the first and second phase shift mask patterns are for transferring line-and-space patterns.

5. A method of manufacturing semiconductor integrated circuit devices according to claim 3, wherein the first and second phase shift mask patterns are for transferring a plurality of hole patterns.

6. A method of manufacturing semiconductor integrated circuit devices comprising the steps of:
   (a) forming a photoresist film on a first main surface of a wafer,
   (b) mounting the wafer provided with the photoresist film on a wafer stage of an exposure apparatus,
   (c) exposing a first phase shift mask pattern including an on-substrate thin film groove shifter to a first region of the main surface of the wafer mounted on the wafer stage by reduction projection exposure using ultraviolet light, the first phase shift mask pattern having phase errors or random defects, and
   (d) after the step (c), exposing a second phase shift mask pattern formed over the same main surface of the same mask substrate as the first phase shift mask pattern, on the first region of the main surface of the wafer mounted on the wafer stage by reduction projection exposure using ultraviolet light, the second phase shift mask pattern including an on-substrate thin film groove shifter, and having phase errors or random defects, and a phase thereof inverted from a phase of the first phase shift mask pattern.

7. A method of manufacturing semiconductor integrated circuit devices according to claim 6, wherein the exposing in the steps (c) and (d) is performed by scanning exposure.

8. A method of manufacturing semiconductor integrated circuit devices according to claim 7, wherein the first and second phase shift mask patterns are on a Levenson-type phase shift mask.

9. A method of manufacturing semiconductor integrated circuit devices according to claim 8, wherein the first and second phase shift mask patterns are for transferring line-and-space patterns.

10. A method of manufacturing semiconductor integrated circuit devices according to claim 8, wherein the first and second phase shift mask patterns are for transferring a plurality of hole patterns.

11. A method of manufacturing semiconductor integrated circuit devices comprising the steps of:
    (a) forming a photoresist film on a main surface of a wafer,
    (b) mounting the wafer provided with the photoresist film on a wafer stage of an exposure apparatus,
    (c) exposing a first phase shift mask pattern having phase errors or random defects on a first region of the main surface of the wafer mounted on the wafer stage by reduction projection exposure using ultraviolet light, and
    (d) after the step (c), exposing a second phase shift mask pattern formed over the same main surface of the same mask substrate as the first phase shift mask pattern, on the first region of the main surface of the wafer mounted on the wafer stage by reduction projection exposure using ultraviolet, the second phase shift mask pattern having phase errors or random defects, and a phase thereof inverted from a phase of the first phase shift mask pattern.

12. A method of manufacturing semiconductor integrated circuit devices according to claim 11, wherein the exposing in the steps (c) and (d) is performed by scanning exposure.

13. A method of manufacturing semiconductor integrated circuit devices according to claim 12, wherein the first and second phase shift mask patterns are on a Levenson-type phase shift mask.

14. A method of manufacturing semiconductor integrated circuit devices according to claim 13, wherein the first and second phase shift mask patterns are for transferring line-and-space patterns.

15. A method of manufacturing semiconductor integrated circuit devices according to claim 13, wherein the first and second phase shift mask patterns are for transferring a plurality of hole patterns.

16. A method of manufacturing semiconductor integrated circuit devices comprising the steps of:
    (a) forming a photoresist film on a main surface of a wafer,
    (b) mounting the wafer provided with the photoresist film on a wafer stage of an exposure apparatus,
    (c) exposing a first phase shift mask pattern including a fine eaves type groove shifter on a first region of the main surface of the wafer mounted on the wafer stage by reduction projection exposure using ultraviolet light, the first phase shift mask pattern having phase errors or random defects, and
    (d) after the step (c), exposing a second phase shift mask pattern including a fine eaves type groove shifter on the first region of the main surface of the wafer mounted on the wafer stage by reduction projection exposure using ultraviolet light, the second phase shift mask patter having phase errors or random defects, and having a phase thereof inverted from a phase of the first phase shift mask pattern.

17. A method of manufacturing semiconductor integrated circuit devices according to claim 16, wherein the second phase shift mask pattern is formed over the same main surface of the same mask substrate as the first phase shift mask pattern.

18. A method of manufacturing semiconductor integrated circuit devices according to claim 17, wherein the exposing in the steps (c) and (d) is performed by scanning exposure.

19. A method of manufacturing semiconductor integrated circuit devices according to claim 18, wherein the first and second phase shift mask patterns are on a Levenson-type phase shift mask.

20. A method of manufacturing semiconductor integrated circuit devices according to claim 19, wherein the first and second phase shift mask patterns are for transferring line-and-space patterns.

21. A method of manufacturing semiconductor integrated circuit devices according to claim 19, wherein the first and second phase shift mask patterns are for transferring a plurality of hole patterns.

22. A method of manufacturing semiconductor integrated circuit devices according to claim 20, wherein an eaves length of the fine eaves groove shifters included in the first and second phase shift mask patterns is set to equal to or less than 20% of the wavelength of exposure light.

23. A method of manufacturing semiconductor integrated circuit devices according to claim 22, wherein an eaves length of the fine eaves groove shifters included in the first and second phase shift mask patterns is set to equal to or less than 10% of the wavelength of exposure light.

24. A method of manufacturing semiconductor integrated circuit devices comprising the steps of:
(a) forming a photoresist film on a main surface of a wafer,
(b) mounting the wafer provided with the photoresist film on a wafer stage of an exposure apparatus,
(c) exposing a first phase shift mask pattern having phase errors or random defects on a first region of the main surface of the wafer mounted on the wafer stage by reduction projection exposure using ultraviolet light,
(d) after the step (c), exposing a second phase shift mask pattern having phase errors or random defects and having a phase thereof inverted from a phase of the first phase shift mask pattern, on the first region of the main surface of the wafer mounted on the wafer stage by reduction projection exposure using ultraviolet light,
(e) after the step (c), exposing again the first phase shift mask pattern to the first region of the main surface of the wafer mounted on the wafer stage by reduction projection exposure using ultraviolet light, and
(f) after the step (d), exposing again the second phase shift mask pattern to the first region of the main surface of the wafer mounted on the wafer stage by reduction projection exposure using ultraviolet light.

25. A method of manufacturing semiconductor integrated circuit devices comprising the steps of:
(a) forming a photoresist film on a main surface of a wafer,
(b) mounting the wafer provided with the photoresist film on a wafer stage of an exposure apparatus,
(c) exposing a first phase shift mask pattern including an auxiliary pattern and having phase errors or random defects, on a first region of the main surface of the wafer mounted on the wafer stage by reduction projection exposure using ultraviolet light, and
(d) after the step (c), exposing a second phase shift mask pattern including an auxiliary pattern, having phase errors and random defects and having a phase thereof inverted from a phase of the first phase shift mask pattern, on the first region of the main surface of the wafer mounted on the wafer stage by reduction projection exposure using ultraviolet light.

26. A method of manufacturing semiconductor integrated circuit devices comprising the steps of:
(a) forming a photoresist film on a main surface of a wafer,
(b) mounting the wafer provided with the photoresist film on a wafer stage of an exposure apparatus,
(c) performing a scanning exposure of a first phase shift mask pattern including a groove shifter and having phase errors or random defects, on a first region of the main surface of the wafer mounted on the wafer stage using ultraviolet light as an exposure light by reduction projection, and
(d) after the step (c), performing a scanning exposure of a second phase shift mask pattern including a groove shifter, having phase errors or random defects and having a phase thereof inverted from a phase of the first phase shift mask pattern, on the first region of the main surface of the wafer mounted on the wafer stage using ultraviolet light as an exposure light by reduction projection.

27. A method of manufacturing semiconductor integrated circuit devices comprising the steps of:
(a) forming a photoresist film on a main surface of a wafer,
(b) mounting the wafer provided with the photoresist film on a wafer stage of an exposure apparatus,
(c) performing a scanning exposure of a first phase shift mask pattern having phase errors or random defects, on a first region of the main surface of the wafer mounted on the wafer stage using ultraviolet light as an exposure light by reduction projection, and
(d) after the step (c), performing a scanning exposure of a second phase shift mask pattern having phase errors or random defects and having a phase thereof inverted from a phase of the first phase shift mask pattern, on the first region of the main surface of the wafer mounted on the wafer stage using ultraviolet light as an exposure light by reduction projection.

* * * * *